United States Patent
Nakayama et al.

(10) Patent No.: US 9,076,546 B2
(45) Date of Patent: Jul. 7, 2015

(54) NONVOLATILE SEMICONDUCTOR STORAGE DEVICE AND CONTROL METHOD THEREOF

(71) Applicant: Powerchip Technology Corporation, Hsin-Chu (TW)

(72) Inventors: Akitomo Nakayama, Tokyo (JP); Hideki Arakawa, Yokohama (JP)

(73) Assignee: POWERCHIP TECHNOLOGY CORP., Hsin-Chu (TW)

( * ) Notice: Subject to any disclaimer, the term of this patent is extended or adjusted under 35 U.S.C. 154(b) by 6 days.

(21) Appl. No.: 14/182,889

(22) Filed: Feb. 18, 2014

(65) Prior Publication Data

US 2015/0078100 A1  Mar. 19, 2015

(30) Foreign Application Priority Data

Sep. 18, 2013  (JP) ................ 2013-193158

(51) Int. Cl.
| | |
|---|---|
| G11C 16/04 | (2006.01) |
| G11C 16/26 | (2006.01) |
| G11C 16/14 | (2006.01) |
| G11C 16/16 | (2006.01) |

(52) U.S. Cl.
CPC .............. *G11C 16/26* (2013.01); *G11C 16/14* (2013.01); *G11C 16/16* (2013.01)

(58) Field of Classification Search
CPC ..... G11C 16/16; G11C 16/14; G11C 16/3445
USPC .............. 365/185.29, 185.18, 189.05, 230.08
See application file for complete search history.

(56) References Cited

U.S. PATENT DOCUMENTS

| | | | |
|---|---|---|---|
| 7,310,275 B2* | 12/2007 | Cha ........................... | 365/189.05 |
| 7,839,679 B2* | 11/2010 | Hosono et al. ........... | 365/185.05 |
| 2008/0279009 A1* | 11/2008 | Park ......................... | 365/185.18 |
| 2015/0078080 A1* | 3/2015 | Lee ........................... | 365/185.03 |

FOREIGN PATENT DOCUMENTS

JP  2004-273098 (A)  9/2004

OTHER PUBLICATIONS

Lee, Changhyuk et al., A 32gb MLC NAND-Flash Memory with Vth-Endurance-Enhancing Schemes in 32nm CMOS, 2010 IEEE International Solid-State Circuits Conference, Feb. 2010, pp. 446-448.

(Continued)

*Primary Examiner* — Connie Yoha
(74) *Attorney, Agent, or Firm* — Muncy, Geissler, Olds & Lowe, P.C.

(57) ABSTRACT

A nonvolatile memory cell array is divided into first and second cell arrays, the page buffer circuit is arranged between the first and second cell arrays, a second latch circuit is arranged by the outside edge section of the first cell array, and the page buffer circuit is connected to the second latch circuit via a global bit line of the first cell array. The data writing to the first or second cell array is controlled by transmitting the writing data to the page buffer circuit via the global bit line from the second latch circuit, after the writing data is latched in the second latch circuit. The data reading of outputting the data read from the first or second cell array to the external circuit is controlled by transmitting data to the second latch circuit from the page buffer circuit via the global bit line.

22 Claims, 24 Drawing Sheets

(56) References Cited

OTHER PUBLICATIONS

Nobunaga, Dean et al., A 50nm 8Gb NAND Flash Memory with 100MB/s Programs Throughput and 200MB/s DDR Interface, 2008 IEEE International Solid-State Circuits Conference, Feb. 2008, pp. 426-428.

Naso, G., et al., A 128Gb 3b/cell NAND Flash Design Using 20nm Planar-Cell Technology, 2013 IEEE International Solid-State Circuits Conference, Feb. 2013, pp. 218-220.

Kim, Hyunggon et al., A 159MM2 32nm 36Gb MLC NAND-Flash Memory with 200MB/s Asynchronous DDR Interface, 2010 IEEE International Solid-State Circuit Conference, Feb. 2010, pp. 442-443.

* cited by examiner

NONVOLATILE SEMICONDUCTOR STORAGE DEVICE AND CONTROL METHOD THEREOF

CROSS REFERENCE TO RELATED APPLICATIONS

This Application claims priority of Japan Patent Application No. 2013-193158, filed on Sep. 18, 2013, the entirety of which is incorporated by reference herein.

BACKGROUND OF THE INVENTION

1. Field of the Invention

The invention is related to a rewritable nonvolatile semiconductor storage device, such as a flash memory, and the control method thereof.

2. Description of the Related Art

NAND type flash EEPROM is formed by a plurality of memory cell transistors connected in series between the bit line and the source line, and a NAND type Nonvolatile semiconductor storage device with high integration (especially, NAND type flash EEPROM) is known.

In order to erase data for a conventional nonvolatile semiconductor storage device, a high voltage (such as 20V) is applied to the semiconductor substrate, and 0V is applied to the word line. Therefore, electrons are ejected from a floating gate with an electric charge accumulation layer consisting of poly-silicon, and its threshold value becomes lower than the erase threshold value (e.g., −3V). On the other hand, for data writing (programming), the semiconductor substrate is provided with 0V, and a control gate is applied a high voltage (such as 20V). Therefore, electrons are injected into the floating gate from the semiconductor substrate, and its threshold value becomes higher than the write threshold value (e.g., 1V). In the memory cells with the threshold value, the control gate is applied a read voltage (such as 0V) between the erase threshold value and the write threshold value, the state of the memory cell can be determined according to whether the current flowing in the memory cell or not.

In addition, in a NAND type nonvolatile semiconductor storage device, there are two kinds of following memory cells corresponding to the number of the bits that can be stored in one memory cell. (1) SLC (Single Level Cell): a memory cell is written 1 bit of data for one memory cell. (2) MLC (Multi-Level Cell): a memory cell is written multiple bits of the data for one memory cell.

BRIEF SUMMARY OF THE INVENTION

The Problem to be Solved

Recently, a NAND flash EEPROM, such as SSD (Solid State Drive), is required to have higher performance than a conventional one. In particular, according to the method of using the DDR (Double Data Rate), the speed of reading into the external circuit from the page buffer configured to temporarily store data read from the memory cell is greatly improved, but the speed of reading into the page buffer from the memory cell is not improved (for example, G. Naso et al., "A 128 Gb 3b/cell NAND Flash Design Using 20 nm Planar-Cell Technology", IEEE ISSCC Digest of Technical Papers, 2013, pp. 218-219; Hyunggon Kim et al., "A 159 mm2 32 nm 32 Gb MLC NAND-Flash Memory with 200 MB/s Asynchronous DDR Interface", IEEE ISSCC Digest of Technical Papers, 2010, pp. 442-443).

In order to increase the speed of reading from the memory cell to the page buffer, it is necessary to reduce the time required to pre-charge and discharge for the global bit lines GBL and the rise time of the word line WL. For this purpose, according to the prior art as shown in FIGS. 12A and 12B, memory cell array 100 is divided into memory banks 101A and 101B at the middle portion, and two page buffer circuits 102A and 102B are configured in the memory banks 101A and 101B respectively (for example, Japan Patent Publication No. 2004-273098; Changhyuk Lee et al., "A 32 Gb MLC NAND-Flash Memory with Vth-Endurance Enhancing Schemes in 32 nm CMOS", IEEE ISSCC Digest of Technical Papers, 2010, pp. 446-447; Dean Nobunaga et al., "A 50 nm 8 Gb NAND Flash Memory with 100 MB/s Program Throughput and 200 MB/s DDR Interface", IEEE ISSCC Digest of Technical Papers, 2008, pp. 426-427). In the memory cell array 100 of FIG. 12B, the resistance and capacitance of the global bit line GBL are half of those in FIG. 12A, and the time constant becomes ¼, but there is a problem in that the chip size increases.

In order to obtain high throughput when programming for the solid state drive, a so-called parallel-programming is adopted. If there are N devices programming simultaneously, the apparent program time is 1/N of the actual program-time. In order to reduce the actual program-time, it may reduce the discharge time and pre-charge of the global bit line GBL by dividing the global bit line GBL into two parts. However, this method has a problem in that it requires double page buffer circuits in the case of the reading method. In the program mode as shown in FIG. 13, because there are four times of discharging or pre-charging the global bit line GBL in the operation period of one program pulse at least, this method is an effective method for reducing the program-time.

FIG. 14A is a circuit diagram illustrating a detailed composition of a page buffer circuit 14A according to the prior art, and FIG. 14B is a circuit diagram simplified from the circuit diagram in FIG. 14A. As shown in FIGS. 14A and 14B, the page buffer circuit 14A comprises two latch circuits 14a and 14b. The latch circuit 14a is configured for temporarily storing data when in the read and program operation and when replacing data. In addition, the latch circuit 14b is configured for data transmission between the data buffer of the external circuit and the latch circuit 14a. In addition, the page buffer circuit 14A comprises a data latch circuit 14c configured to temporarily store data by using a metal oxide semiconductor field effect transistor (hereafter referred as to "MOS transistor") Q30 of FIG. 14A. Further, as the peripheral circuit of the page buffer circuit 14A, the bit line switch circuit 21 is configured to selectively switch one of the two global bit lines GBLe and GBLo. Furthermore, it is necessary to provide the page buffer circuit 14A between the pitches of the memory cell, its length is about 700 microns, for example, and it is relatively large.

The purpose of the present invention is to solve the above problems by providing a nonvolatile semiconductor storage device and control method thereof with a chip size smaller than conventional ones, and improving the read speed from a memory cell to a page buffer.

Solutions to the Problem

A first embodiment of the nonvolatile semiconductor storage device according to the invention comprises: a nonvolatile memory cell array, having a plurality of memory cells connected to global bit lines; a page buffer circuit, having a first latch circuit temporarily storing data read and written to the nonvolatile memory cell array by a predetermined page unit; a second latch circuit, temporarily storing data input from and output to an external circuit; and a control circuit, controlling data reading and writing of the nonvolatile memory cell array. The nonvolatile memory cell array is divided into a first cell array and a second cell array, the page buffer circuit is arranged between the first cell array and the second cell array, and the second latch circuit is arranged by the outside edge section of the first cell array. The page buffer circuit is connected to the second latch circuit via a global bit line of the first cell array. The control circuit controls data writing to the first cell array or the second cell array by transmitting the writing data to the page buffer circuit from the second latch circuit via the global bit line of the first cell array, after the writing data from the external circuit is latched in the second latch circuit, for data writing. The control circuit controls outputting the data read from the first cell array or the second cell array to the external circuit by transmitting data to the second latch circuit from the page buffer circuit via the global bit line of the first cell array, for data reading.

In an embodiment of the nonvolatile semiconductor storage device, the control circuit controls the time division operation of at least one of the following: data writing, data reading and data erasing in the first cell array and the second cell array.

In the embodiment, the control circuit controls each timing of data programming and verifying with time shifts between the first cell array and the second cell array by a predetermined delay time. In another embodiment, the control circuit controls data verification for the second cell array at the time of data writing for the first cell array, or it controls the data verification for the first cell array at the time of data writing for the second cell array. In an alternative embodiment, the control circuit controls data erasing for the first cell array and the second cell array simultaneously, and performs data verification for the first cell array and the second cell by the time division operation.

In addition, in the embodiment of the nonvolatile semiconductor storage device, the page buffer circuit further comprises a third latch circuit which stores shunted data of another cell array when the first cell array or the second cell array performs data writing or data reading.

Furthermore, in the embodiment of the nonvolatile semiconductor storage device, the third latch circuit further comprises a plurality of latches for memory cells in an MLC of storing data of a plurality of bits for each of the memory cells.

Furthermore, in the embodiment of the nonvolatile semiconductor storage device, the third latch circuit further comprises a global bit line of the first cell array or the second cell array, and a switch unit, wherein the third latch circuit is constructed by a dynamic latch circuit composed of a stray capacitance of the global bit line of the first cell array or the second cell array and the switch unit.

Furthermore, in the embodiment of the nonvolatile semiconductor storage device, the control circuit directly transmits data from the third latch circuit to the second latch circuit via the global bit line of the first cell array at the time of data reading.

A second embodiment of the nonvolatile semiconductor storage device according to the invention comprises a nonvolatile memory cell array having a plurality of memory cells connected to global bit lines, a page buffer circuit having a first latch circuit temporarily storing data read and written to the nonvolatile memory cell array by a predetermined page unit, a second latch circuit temporarily storing data input from and output to an external circuit, and a control circuit controlling data reading and writing of the nonvolatile memory cell array. The nonvolatile memory cell array is divided into a first cell array and a second cell array, the page buffer circuit is arranged between the first cell array and the second cell array, and the second latch circuit is arranged by the outside edge section of the first cell array. The nonvolatile semiconductor storage device comprises a data bit line connecting the page buffer circuit to the second latch circuit. The control circuit controls data writing to the first cell array or the second cell array by transmitting the writing data to the page buffer circuit from the second latch circuit via the data bit line, after the writing data from the external circuit is latched in the second latch circuit, for data writing. The control circuit controls outputting the data read from the first cell array or the second cell array to the external circuit by transmitting data from the page buffer circuit to the second latch circuit via the data bit line, for data reading.

In an embodiment of the nonvolatile semiconductor storage device, the control circuit controls a time division operation of at least one of the following: data writing, data reading and data erasing for the first cell array and the second cell array.

In the embodiment, the control circuit controls each timing of data programming and verifying with time shifts between the first cell array and the second cell array by a predetermined delay time. In another embodiment, the control circuit controls data verification for the second cell array at the time of data writing for the first cell array, or it controls the data verification for the first cell array at the time of data writing for the second cell array. In an alternative embodiment, the control circuit controls data erasing for the first cell array and the second cell array simultaneously, and performs data verification for the first cell array and the second cell by the time division operation.

In addition, in the embodiment of the nonvolatile semiconductor storage device, the page buffer circuit further comprises a third latch circuit which stores shunted data of another cell array when the first cell array or the second cell array performs data writing or data reading.

Furthermore, in the embodiment of the nonvolatile semiconductor storage device, the third latch circuit further comprises a plurality of latches for memory cells in an MLC of storing data of a plurality of bits for each of the memory cells.

Furthermore, in the embodiment of the nonvolatile semiconductor storage device, the page buffer circuit further comprises another data bit line other than the data bit line connecting the page buffer circuit to the second latch circuit; and a switch unit controlling the connection of the page buffer circuit.

In the embodiment, the third latch circuit comprises the data bit line or the another data bit line and the switch unit, wherein the third latch circuit is constructed by a dynamic latch circuit composed of a stray capacitance of the stray capacitance of the data bit line or the another data bit line and the switch unit.

Furthermore, in the embodiment of the nonvolatile semiconductor storage device, the third latch circuit further comprises a global bit line of the first cell array or the second cell array, and a switch unit, wherein the third latch circuit is constructed by a dynamic latch circuit composed of a stray capacitance of the global bit line of the first cell array or the second cell array and the switch unit.

Furthermore, in the embodiment of the nonvolatile semiconductor storage device, the control circuit directly transmits data from the third latch circuit to the second latch circuit via the global bit line of the first cell array at the time of data reading.

A third embodiment of the invention is related to a control method for a nonvolatile semiconductor storage device comprising a nonvolatile memory cell array having a plurality of memory cells connected to global bit lines, a page buffer circuit having a first latch circuit temporarily storing data read and written to the nonvolatile memory cell array by a predetermined page unit, a second latch circuit temporarily storing data input from and output to an external circuit, and a control circuit controlling the data reading and data writing of the nonvolatile memory cell array. The nonvolatile memory cell array is divided into a first cell array and a second cell array, the page buffer circuit is arranged between the first cell array and the second cell array, and the second latch circuit is arranged by the outside edge section of the first cell array. The page buffer circuit is connected to the second latch circuit via a global bit line of the first cell array. The control method comprises using the control circuit to control data writing to the first cell array or the second cell array by transmitting the writing data to the page buffer circuit from the second latch circuit via the global bit line of the first cell array, after the writing data from the external circuit is latched in the second latch circuit, for data writing, and using the control circuit to control outputting the data read from the first cell array or the second cell array to the external circuit by transmitting data to the second latch circuit from the page buffer circuit via the global bit line of the first cell array, for data reading.

A fourth embodiment of the invention is related to a control method for a nonvolatile semiconductor storage device comprising a nonvolatile memory cell array having a plurality of memory cells connected to global bit lines, a page buffer circuit having a first latch circuit temporarily storing data read and written to the nonvolatile memory cell array by a predetermined page unit, a second latch circuit temporarily storing data input from and output to an external circuit, and a control circuit controlling data reading and writing of the nonvolatile memory cell array. The nonvolatile memory cell array is divided into a first cell array and a second cell array, the page buffer circuit is arranged between the first cell array and the second cell array, and the second latch circuit is arranged by the outside edge section of the first cell array. The nonvolatile semiconductor storage device comprises a data bit line connecting the page buffer circuit to the second latch circuit. The control method comprises a step of using the control circuit to control data writing to the first cell array or the second cell array by transmitting to the page buffer circuit from the second latch circuit via the data bit line, after the writing data from the external circuit is latched in the second latch circuit, for data writing, and a step of using the control circuit to control outputting the data read from the first cell array or the second cell array to the external circuit by transmitting data to the second latch circuit from the page buffer circuit via the data bit line, for data reading.

Effects of the Invention

Accordingly, the nonvolatile semiconductor storage device and control method thereof according to the invention can make a chip size smaller than conventional ones, and improving the read speed from a memory cell to a page buffer.

DETAILED DESCRIPTION OF THE INVENTION

Structures for Embodiments of the Invention

The embodiments of the present invention are discussed in detail below with reference to the accompanying drawings. In addition, the same component in each of the embodiments is referred to using the same symbol.

Embodiment of a Basic Circuit

Figure 1:
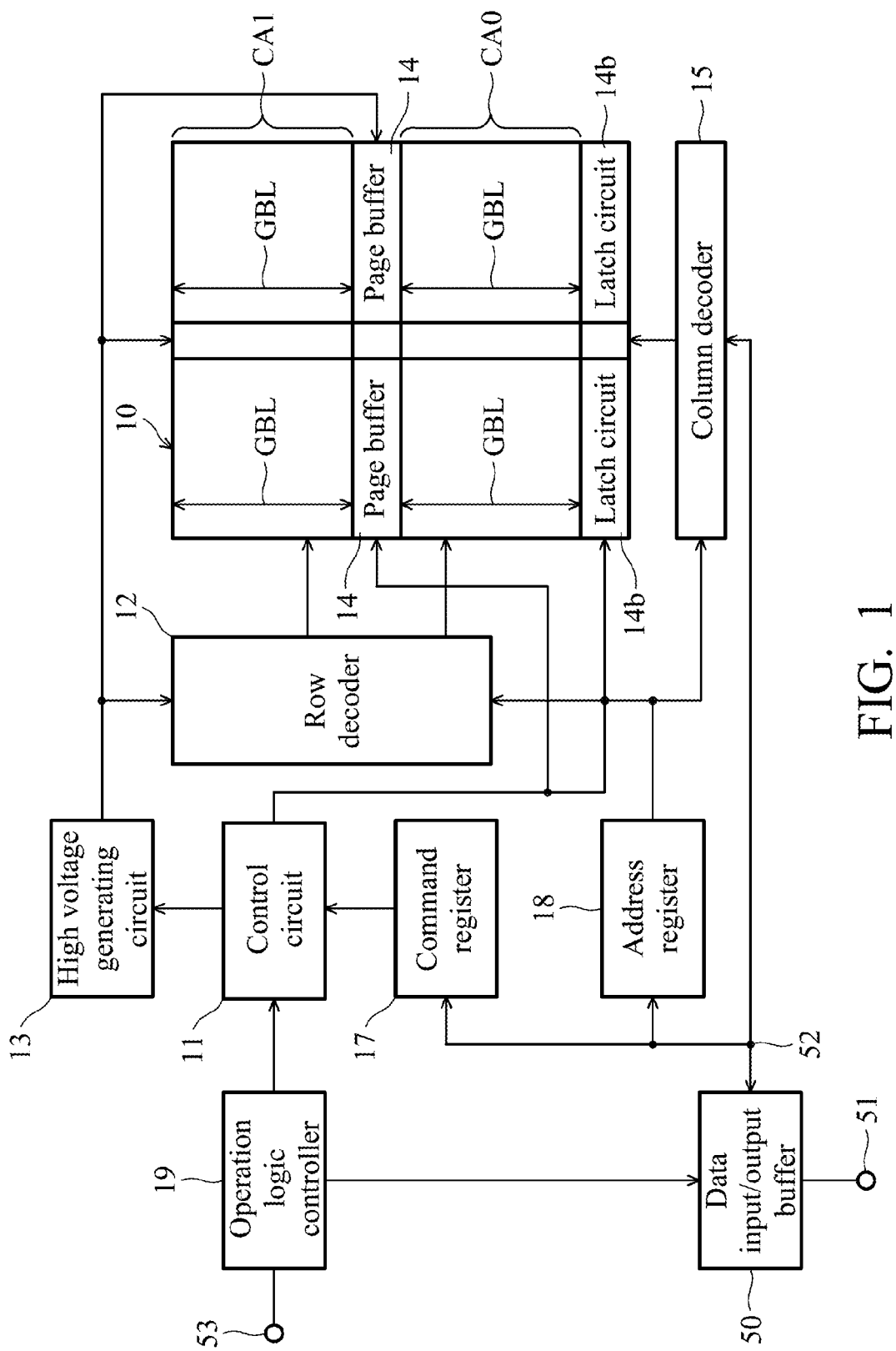
FIG. 1 is a block diagram illustrating an embodiment of a basic circuit related to the constitution of the NAND-type flash EEPROM.

FIG. 1 is a block diagram illustrating an embodiment of a basic circuit related to the constitution of the NAND-type flash EEPROM. First, the constitution of the NAND-type flash EEPROM is described in the following paragraphs.

In the embodiment of FIG. 1, the NAND-type flash EEPROM comprises a memory cell array 10, a control circuit 11 controlling the operations of the NAND-type flash EEPROM, a high voltage generating circuit 13, a page buffer circuit 14, a column decoder 15, a command register 17, an address register 18, an operation logic controller 19, a data input/output buffer 50, plural data input/output terminal 51, and plural control signal input terminal 53. In addition, 52 is a data bus line.

In the embodiment, in order to make the pre-charge and discharge periods of the global bit line shorter than those of the conventional global bit line, the memory cell array 10 is divided to two memory banks as a cell array CA0 and a cell array CA1, and the global bit line GBL is divided into two portions. Therefore, the page buffer 14 is arranged to comprise a latch circuit 14a between two cell arrays CA0 and CA1, and the latch circuit 14b is placed in one edge part of the longitudinal direction of the global bit line GBL (the outside edge part of the cell array CA0) in the cell array 10. In addition, in the embodiment of FIG. 1, the cell array 10 is divided into two sectors or banks in a direction perpendicular to the longitudinal direction of the global bit line GBL.

In other words, the conventional embodiment configures two page buffer circuits 14 in the longitudinal direction of the global bit line GBL, but the embodiment of the invention configures only one page buffer circuit 14. In the embodiment, the page buffer circuit 14 to perform data write and data read for the predetermined page unit comprises a sense amplifier (SA) and a data latch circuit 14c (DL) prepared for each set of the global bit line GBLs (GBLe, GBLo), as shown in FIGS. 2, 3A, 4A, 5A. In addition, the sense amplifier (SA) is composed of some elements including a latch circuit 14a.

In FIG. 1, in order to select the word line WL and the bit line GBL of the memory cell array 10, a row decoder 12 and column decoder 15 are installed. The control circuit 11 controls the sequence of data write, data erase and data read. The high voltage generating circuit 13 is controlled by the control circuit 11, and generates the boosted high voltage or middle-voltage for data write, data erase and data read.

The data input/output buffer 50 is configured for data input/output and input of the address signal. In other words, the data transmission between the input/output terminal 51 and the page buffer circuit 14 is performed by the data input/output buffer 50, the data bus line 52 and the latch circuit 14b. The address signal input from the input/output terminal 51 is stored in the address register 18, and transmitted to the row decoder 12 and column decoder 15 for decoding. The operation control command is also input from the input/output terminal 51. The input command is decoded and stored in the command register 17, and the control circuit 11 is controlled accordingly. The external signal, such as a chip enable signal CEB, a command latch enable signal CLE, an address latch enable signal ALE, a write enable signal WEB and a read enable signal REB, is captured in the operation logic controller 19 via the control signal input terminal 53, and the inner control signal is generated in response to the operation mode. The inner control signal is configured for data latch and transmission of the input/output buffer 50, and transmits to the control circuit 11 for controlling operations.

The first, second, third and fourth embodiments in the following description are constructed by the basic circuit of FIG. 1.

First Embodiment

Figure 2:
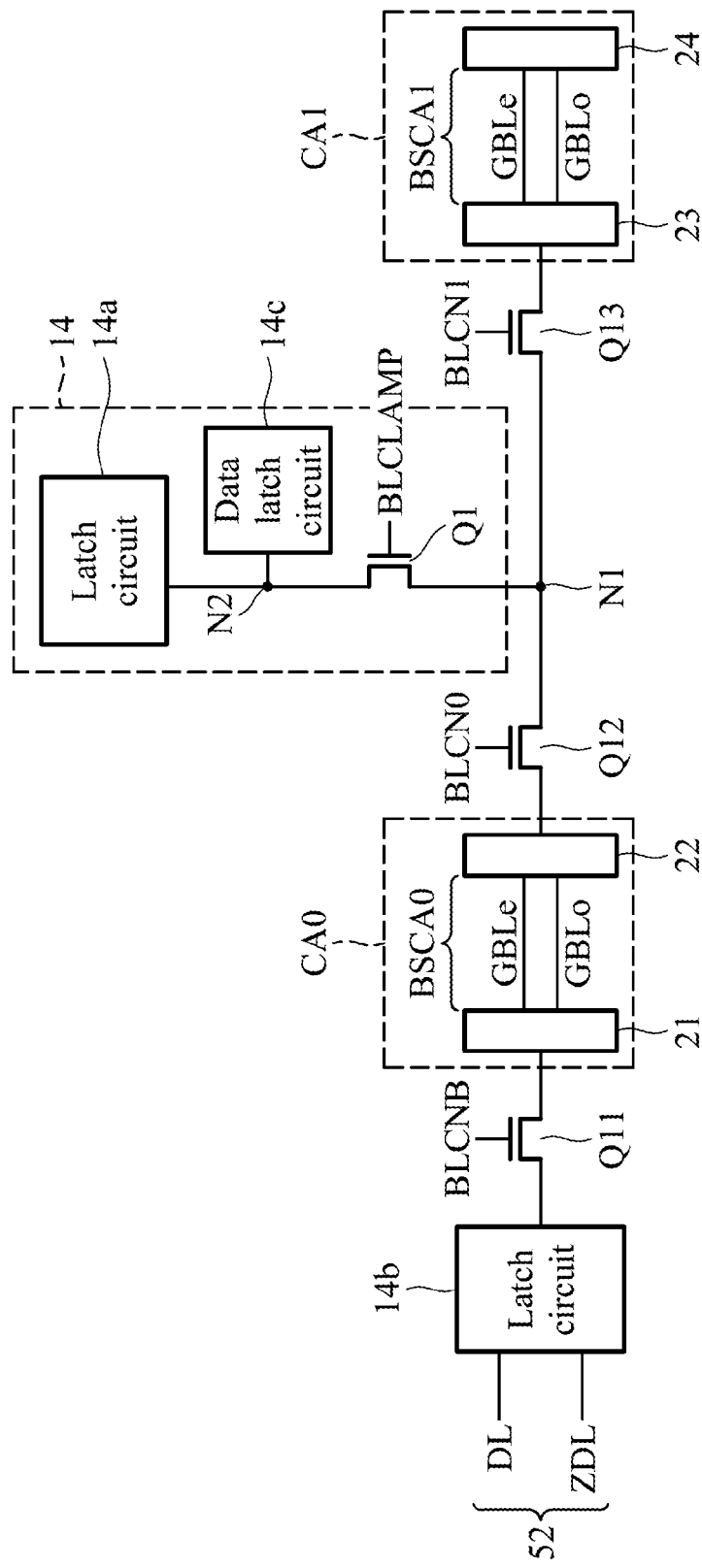
FIG. 2 is a circuit diagram illustrating a memory cell array 10 and the peripheral circuits of the NAND-type flash EEPROM according to a first embodiment of the invention.

FIG. 2 is a circuit diagram illustrating a memory cell array 10 and the peripheral circuits of the NAND-type flash EEPROM according to a first embodiment of the invention.

In FIG. 2, the cell array CA0 comprises a plurality of block size cell arrays BSCA0, and each of the block size cell arrays BSCA0 comprises a pair of global bit lines GBLe, GBLo connected to plural memory cells respectively. By this, a plurality of electrical-rewritable and nonvolatile memory cells MC0-MC15 with stacked-gate structure connected in series are provided in the pair of global bit lines GBLe, GBLo. The global bit line switch circuit 21, 22 are provided at both sides of the ends of the pair of global bit lines GBLe, GBLo, and select one of the global bit lines GBLe and GBLo to connect with the corresponding circuit. In addition, the cell array CA1 comprises a plurality of block size cell arrays BSCA1, and each of the block size cell arrays BSCA1 comprises a pair of global bit lines GBLe, GBLo connected to plural memory cells respectively. By this, a plurality of electrical-rewritable and nonvolatile memory cells MC0-MC15 with stacked-gate structure connected in series are provided in the pair of global bit lines GBLe, GBLo. The global bit line switch circuit 23, 24 are provided at both sides of the ends of the pair of global bit lines GBLe, GBLo, and select one of the global bit lines GBLe and GBLo to connect with the circuit of the end.

A data bus line 52 formed by two differential data lines DL, ZDL is connected to a terminal of the latch circuit 14b, and the other terminal of the latch circuit 14b is connected to an end of the global bit line switch circuit 21 via the MOS transistor Q11 forming a switch unit controlled by a control signal BLCNB. An end of the global bit line switch circuit 22 is connected to the bit line node N1 (hereafter referred to as "node") via the MOS transistor Q12 forming a switch unit controlled by a control signal BLCN0. The node N1 is connected to the page buffer circuit 14, and also connected to an end of the global bit line switch circuit 23 via the MOS transistor Q13 forming a switch unit controlled by a control signal BLCN1.

The page buffer circuit 14 has the functions of data latch, data sense, data program and program verification, and the page buffer circuit 14 is formed by the latch circuit 14a constituting the sense amplifier, the data latch circuit 14c storing the temporally shunted data, and the MOS transistor Q1 forming a switch unit controlled by the control signal BLCLAMP. The node N1 is connected to the latch circuit 14a and the data latch circuit 14c via the MOS transistor Q1 and a sense node N2.

The composition of the memory cell array 10 and its peripheral circuits described above is provided with the global bit line switch circuit 24 (right end of FIG. 2; top part of FIG. 1), but the invention is not limited thereto. If the peripheral circuit is not necessary, the peripheral circuit can be removed.

In regards to the composition of the memory cell array 10 and its peripheral circuits described above, during the data reading, the latch circuit 14a latches the data sensed and read from the selected cell array CA0 or CA1 and transmits the data to the latch circuit 14b via the global bit line GBLo or GBLe of the cell array CA0. In addition, during the data programming (writing), the input data is transmitted from the latch circuit 14b to the latch circuit 14a via the global bit line GBLo or GBLe of the cell array CA0 at first, and page buffer circuit 14 programs data and verifies the data programming for the memory cell of the selected cell array CA0 or CA1. In addition, the page buffer circuit 14 is placed between the cell arrays CA0 and CA1 in the middle of memory cell array 10, so there is a special effect in that it is not necessary to transmit the data for judgment of program verification from the latch circuit 14a to the latch circuit 14b.

The circuit of FIG. 2 can perform parallel programming for the cell arrays CA0 and CA1 (SLC) according to the following description.

(1) It assumes that the program operation for the memory cells of the cell array CA0 has been started, and the latch circuit 14b receives the page data of the cell array CA1 Further, the MOS transistors Q1, Q11-Q13 are turned off by the control signals BLCLAMP, BLCNB, BLCN0 and BLCN1.

(2) Next, after the period of program verification for the cell array CA0 (MOS transistors Q1 and Q12 are turned on), the data in the latch circuit 14a for writing into the cell array CA0 is moved to the data latch circuit 14c for shunting.

(3) Therefore, the data in the latch circuit 14b is transmitted to the latch circuit 14a via the global bit line GBLo or GBLe of the cell array CA0 (the MOS transistors Q11 and Q12 are turned on), and programming of the page data of the cell array CA1 starts. Next, when the programming is finished, the MOS transistor Q13 is turned off by the control signal BLCN1.

(4) The MOS transistor Q12 is turned on by the control signal BLCN0, the data in the latch circuit 14c is transmitted to the latch circuit 14a via the global bit line GBLo or GBLe of the cell array CA0, reprogramming (it is limited to the memory cells with program failure) of the page data of the cell array CA0 starts, and the program is performed. Therefore, the parallel programming for the cell arrays CA0 and CA1 is progressing. Next, as similar to (3), and the MOS transistor Q12 is turned off by the control signal BLCN0.

(5) Since a program for the cell array CA1 is previously completed, program verification is previously performed to the cell array CA1 In regards to the period of the program verification for the cell array CA1 (the MOS transistors Q1 and Q13 are turned on). At first, to restore (hereafter referred to as "pre-read" or "preceding read") the original write data of the data of the cell array CA1, the page buffer circuit 14 senses (read) the voltage of the global bit lines GBLo and GBLe and latches the data in the latch circuit 14a, and the actual program verification is performed. After the program verification, if further programming is needed, the MOS transistor Q3 is turned on by the control signal BLCN1, and the programming starts in a way that is similar to (3).

(6) Next, since a program for the cell array CA0 is completed, the program verifying and programming is performed for the cell array CA0 in a way that is similar to (5).

Although the above-mentioned programming operations are operations for SLC, the latch circuit 14c can be formed to have ability to latch a plurality of data, when it performs for memory cell array 10 of the MLC. For the MLC, 1 bit share is available for the voltage of the global bit line as above, but it is necessary to add at least a data latch circuit 14c for the other bits.

In addition, the circuit of FIG. 2 can perform parallel reading for the cell arrays CA0 and CA1 (SLC) according to the following description.

(1) The MOS transistors Q1, Q12 and Q13 are turned on by the control signals BLCLAMP, BLCN0 and BLCN1, and the global bit lines GBLe and GBLo of both the cell array CA0 and CA1 are pre-charged. Next, the MOS transistors Q12 controlled by the control signal BLCN0 and the MOS transistors Q13 controlled by the control signal BLCN1 are turned off.

(2) At first, the global bit lines GBLe and GBLo start discharging by the cell current of the cell array CA0.

(3) Next, after a determined period, the global bit lines GBLe and GBLo of the cell arrays CA1 start discharging. The reason for waiting the predetermined period is that ensures that the time periods from the discharging ends to sensing starts for the cell arrays CA0 and CA1 are the same.

(4) The MOS transistor Q12 controlled by the control signal BLCN0 is turned on, and the page buffer circuit 14 starts sensing each of the memory cells of the cell array CA0. By this, the sensed data is latched in the latch circuit 14a, and the inverse of the data is transmitted to the latch circuit 14c.

(5) Next, while the MOS transistor Q13 controlled by the control signal BLCN1 is turned on, the MOS transistor Q12 controlled by the control signal BLCN0 is turned off. Therefore, the sensing of the cell array CA1 starts. By this, the sensed data is latched in the latch circuit 14a.

(6) After the data in the latch circuit 14c and the data in the latch circuit 14a interchange to each other, the MOS transistors Q1, Q12 and Q13 are turned on, the data (namely, the data in each of memory cells of cell array CA0) in the latch circuit 14a is transmitted to the latch circuit 14b via the global bit lines GBLe or GBLo of the cell array CA0, and output to the data input/output buffer 50 (as shown in FIG. 1) via data line 52.

(7) Similarly, the data of the cell array CA1 is transmitted and output from the latch circuit 14a.

In the step (6) of the embodiment of the above-mentioned reading operations, the data in the latch circuit 14c is transmitted to the latch circuit 14b via the data latch circuit 14a, but the invention is not limited thereto. In step (6), the data in the latch circuit 14c can be directly transmitted to the latch circuit 14b. This modified embodiment is also suitable for the second, third and fourth embodiment.

Although the above-mentioned reading operations are operations for SLC, the latch circuit 14c can be formed to have the ability to latch a plurality of data, when it performs the reading operations for memory cell array 10 of the MLC.

As described above, the circuit in FIG. 2 can program two cell arrays CA0 and CA1 in parallel by time division operation. According to the circuits in FIGS. 1 and 2, the chip size can become smaller than conventional size, and it improves the read speed from a memory cell to a page buffer in parallel by time division operation.

Second Embodiment

Figure 3A:
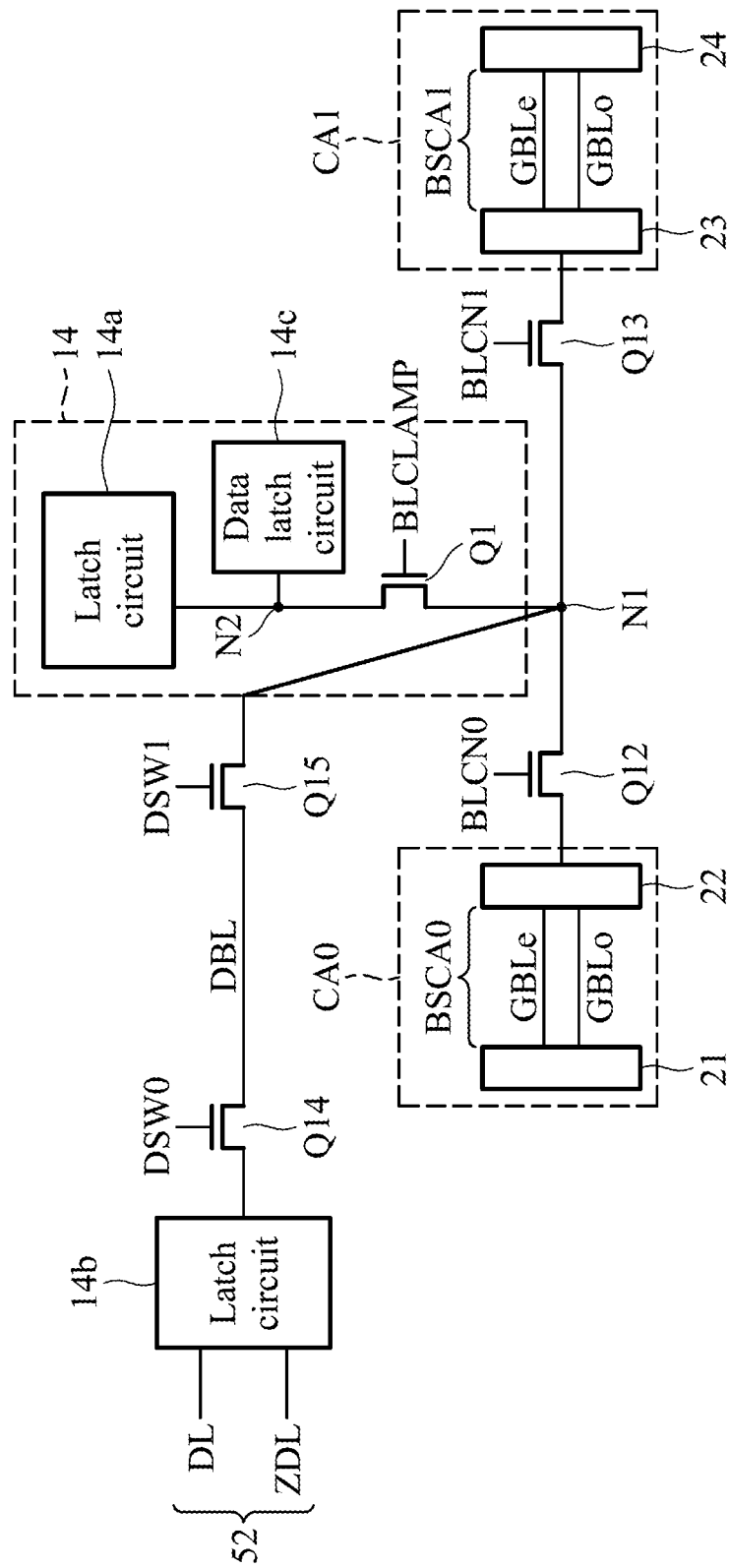
FIG. 3A is a circuit diagram illustrating a memory cell array 10 and the peripheral circuits of the NAND-type flash EEPROM according to a second embodiment of the invention.

FIG. 3A is a circuit diagram illustrating a memory cell array 10 and the peripheral circuits of the NAND-type flash EEPROM according to a second embodiment of the invention. Although the data to the page buffer circuit 14 or the data from the page buffer circuit 14 is transmitted through the global bit line GBLo or GBLe of the cell array CA0 in the circuit of FIG. 2, there are the following differences between the circuit in FIG. 2 and the circuit in FIG. 3A: (1) using a device with multiple layers, the data bit line DBL connecting node N1 and the latch circuit 14b are installed in a higher layer than the memory cell. In the embodiment, the two layers can be connected via the via-conductor. The differences are described in the following paragraphs.

In FIG. 3A, the latch circuit 14b is connected to the node N1 through the MOS transistor Q14 controlled by the control signal DSW0, the data bit line DBL and the MOS transistor Q15 controlled by the control signal DSW1. Because the data bit line DBL is constituted by a metal line wider than the global bite line GBL, the speed limit can be relaxed. Therefore, for the data transmission, the parallel program and parallel read operations are simple sequences in comparison with the circuit of FIG. 2, and there is a special effect in that the transmission speed becomes higher.

In addition, the MOS transistor Q11 in FIG. 2 is constituted by a high voltage transistor, so the size is large. However, the MOS transistors Q14 and Q15 newly added in the circuit of FIG. 3A are constituted by low-voltage transistors, so the chip size of the device can be smaller.

Furthermore, when the pitch between the data bit lines DBLs can be accomplished as the pitch between the pair of global bit lines constituted by the pair of global bit lines GBLe and GBLo, the other bit line DBL is used as the data latch circuit 14c. For example, if another bit line DBL is formed for the cell array CA1, the number of data latch circuits 14c for the MLC operation can be reduced. It means that the dynamic latch circuit, consisting of the stray capacitance of the data bit line DBL or the above-mentioned other data bit line and the MOS transistors such as Q15 (which includes the MOS transistor Q15 and the other MOS transistor is the other switch unit corresponding to the MOS transistor Q15 on the other bit line) can be used as the data latch circuit 14c.

Furthermore, two cell arrays CA0 and CA1 are used as one memory block, and their parallel operations of two pages can be accomplished.

As described above, the circuit in FIG. 3A can program two cell arrays CA0 and CA1 by time division in parallel, and also can read data by time division in parallel. According to the circuits in FIGS. 2 and 3A, the chip size can become smaller than the conventional size, and the read speed from a memory cell to a page buffer can be improved by time division operation in parallel.

In addition, in FIG. 3A, the global bit line switch circuits 21 and 24 can be omitted.

Figure 3B:
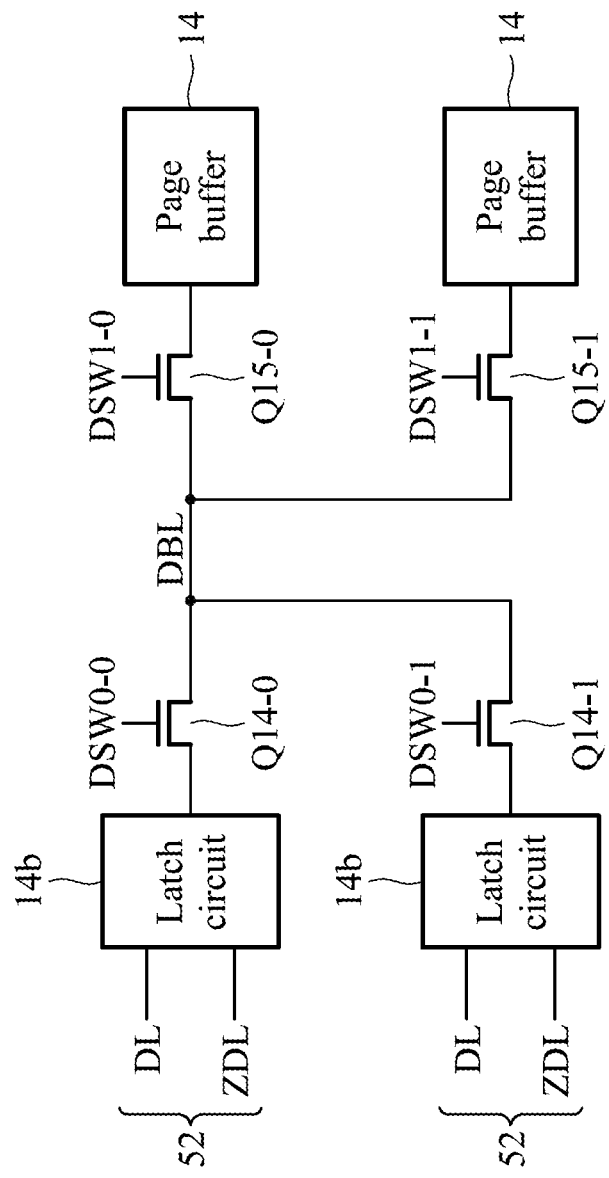
FIG. 3B is a circuit diagram illustrating a memory cell array 10 and the peripheral circuits of the NAND-type flash EEPROM according to a modification of the second embodiment of the invention.

FIG. 3B is a circuit diagram illustrating a circuit modified from the embodiment of FIG. 3A. When the pitch between the data lines DBL must be larger than the pitch between the global bit line pair formed by the global bit line GBLe and GBLo, it can use the adjacent two page buffer circuits 14 connecting with one data bit line DBL, which is shared by the time division multiplex. For example, as shown in FIG. 3B, a MOS transistor Q14-0 serving as a switch unit controlled by the control signal DSW0-0, a MOS transistor Q14-1 serving as a switch unit controlled by the control signal DSW0-1, a MOS transistor Q15-0 serving as a switch unit controlled by the control signal DSW1-0, a MOS transistor Q15-1 serving as a switch unit controlled by the control signal DSW1-1 are used. One of the corresponding pair of MOS transistors (Q14-0 and Q15-0, or Q14-1 and Q15-1) is on, and the other one is off, so that the data bit lines DBL can be shared by the time division when data is transmitted via one data line DBL.

Third Embodiment

Figure 4A:
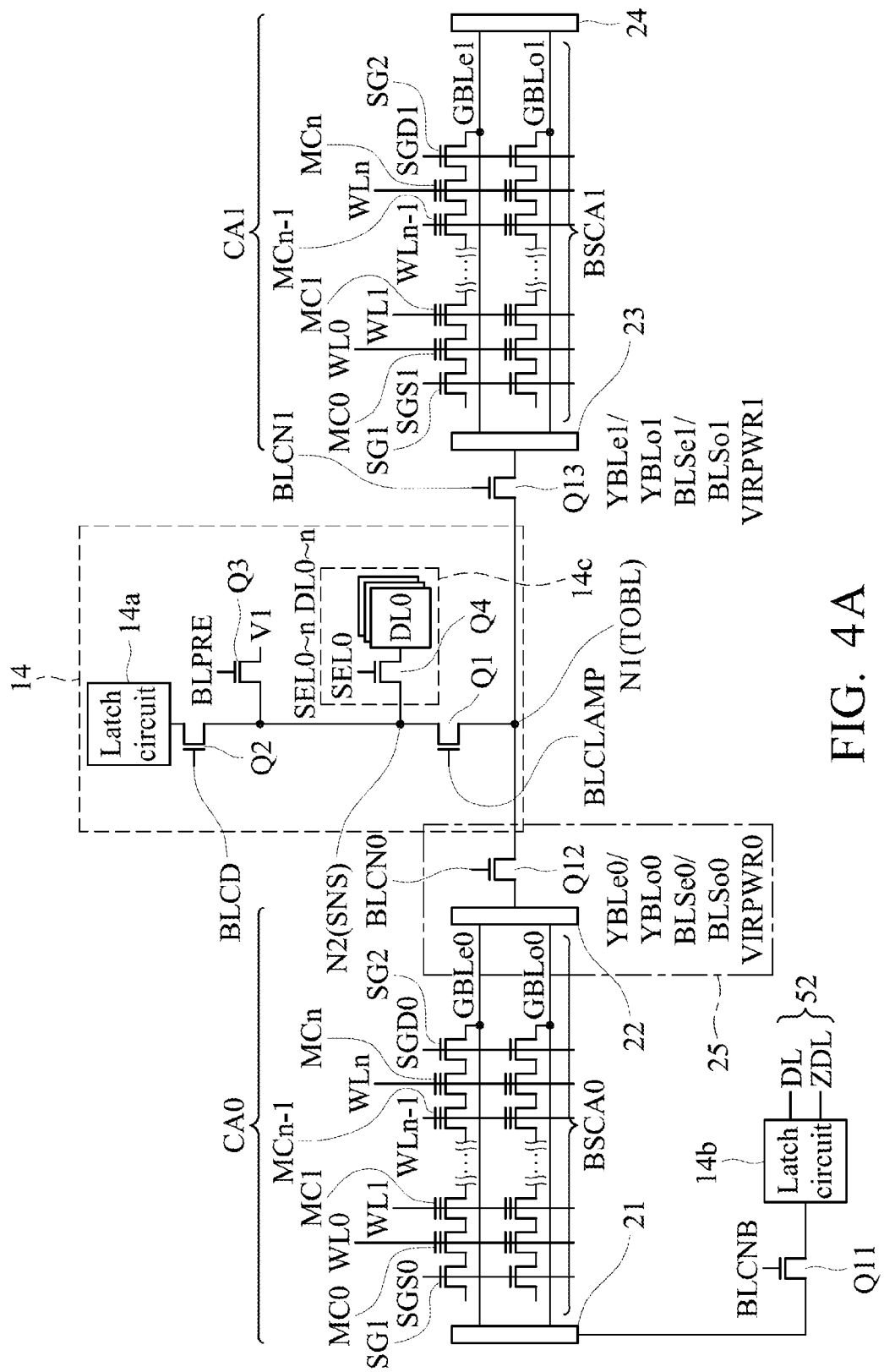
FIG. 4A is a circuit diagram illustrating a memory cell array 10 and the peripheral circuits of the NAND-type flash EEPROM according to a third embodiment of the invention.
Figure 4B:
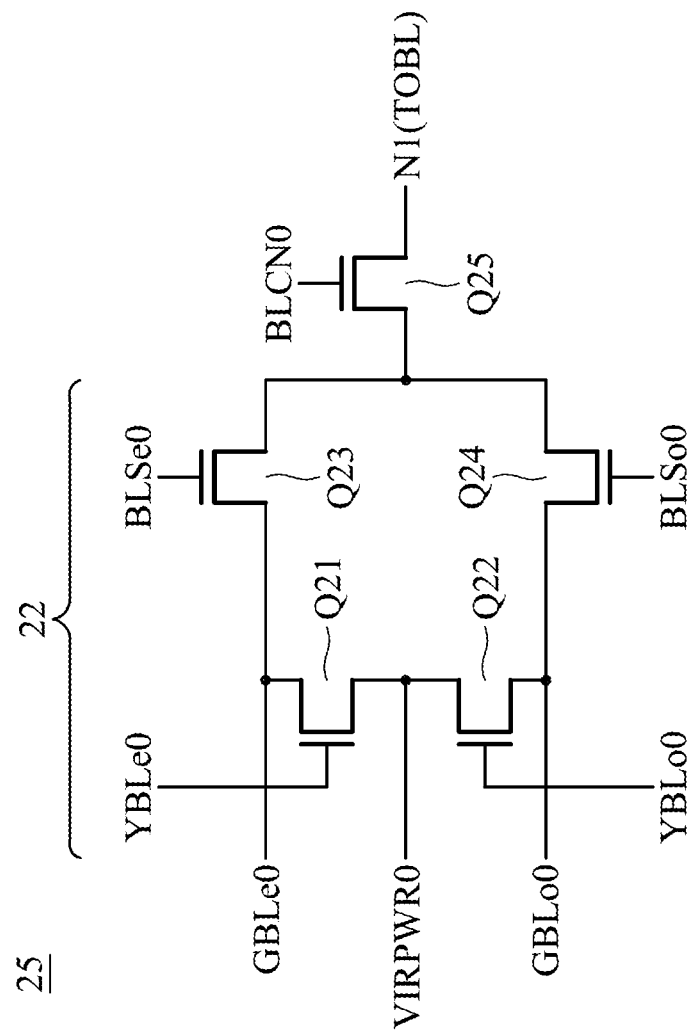
FIG. 4B is a circuit diagram illustrating the detailed composition of the global bit line switch circuit part 25 in FIG. 4A.

FIG. 4A is a circuit diagram illustrating a memory cell array 10 and the peripheral circuits of the NAND-type flash EEPROM according to a third embodiment of the invention, FIG. 4B is a circuit diagram illustrating the detailed composition of the global bit line switch circuit part 25 in FIG. 4A. In the embodiment, the third embodiment is the specific example concretely illustrating a circuit of the first embodiment.

There are the following differences between the circuit in FIG. 2A and the circuit in FIG. 4A. (1) The block size cell arrays BSCA0 and BSCA1 comprise selection transistors SG1 and SG2, and a NAND cell unit formed by a plurality (n) of electrical-rewritable and nonvolatile memory cells MC0-MCn with stacked-gate structure connected in series is connected to the pair of global bit lines GBLe, GBLo. In the embodiment, the control gates of each memory cell MC0-MCn forming a line in the row direction are commonly connected to word lines WL0-WLn respectively, and the gate electrode of the selection transistors SG1 and SG2 are connected to selection gate lines SGD0, SGS0 or SGD1, SGS1 disposed parallel to the word line WL. The range of memory cells selected by one word line (one of the word lines WL0-WLn) is one page as a unit for writing and reading. A plurality of NAND cell units within one page or its integer multiple pages are one block as a unit for data erasing. (2) It discloses that the global bit line switch circuit 21 is switching-controlled by the control signals BLSBe and BLSBo. (3) It discloses that the global bit line switch circuit 22 is switching-controlled by the control signals YBLe0, YBLo0, BLSe0, BLSo0 and VIRPWR0. In addition, the global bit line switch circuit 22 and the MOS transistor Q12 constitute the global bit line switch circuit part 25 in FIG. 4B.

Figure 14A:
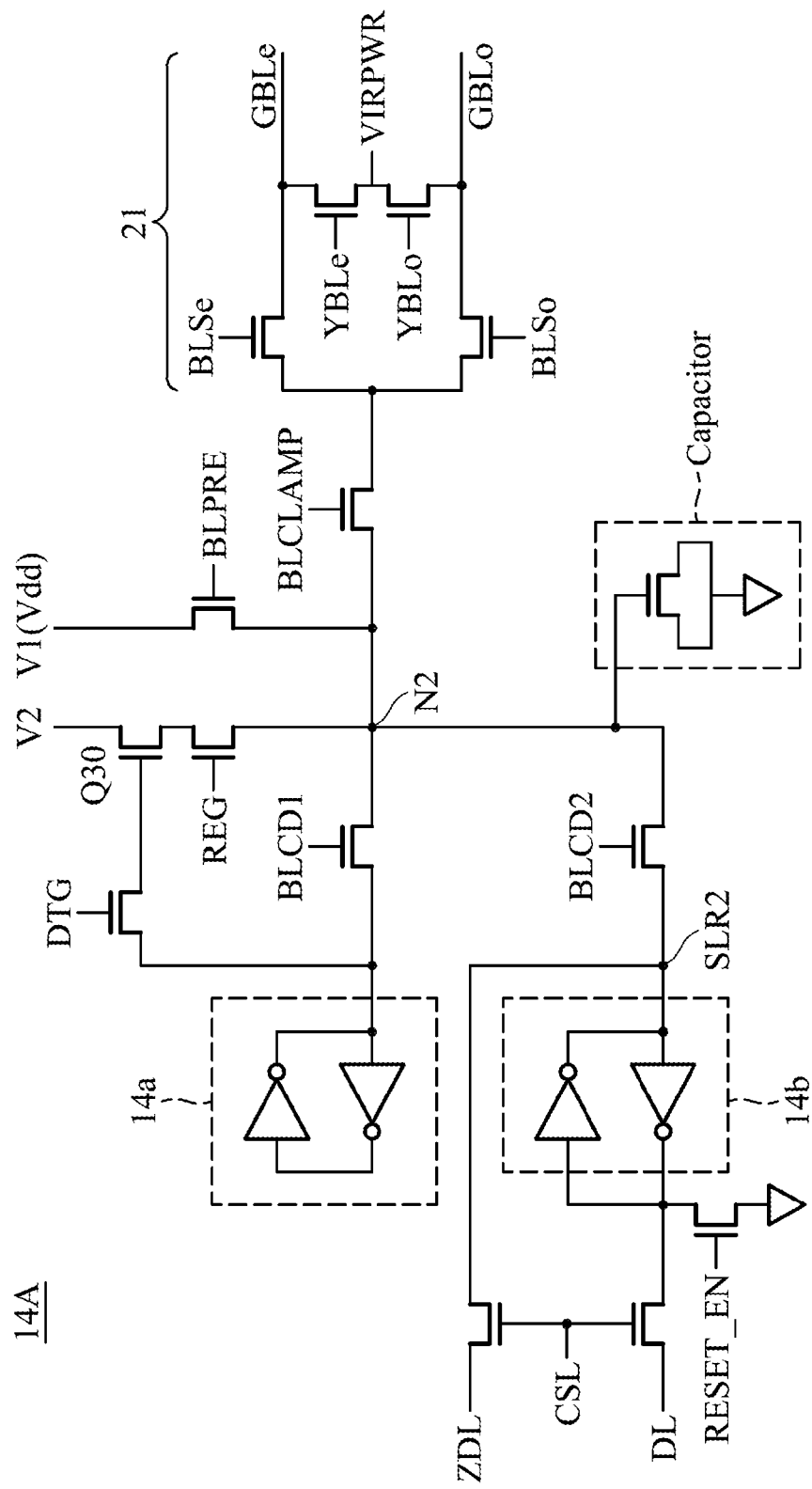
FIG. 14A is a circuit diagram illustrating a detailed composition of a page buffer circuit 14A according to prior art.
Figure 14B:
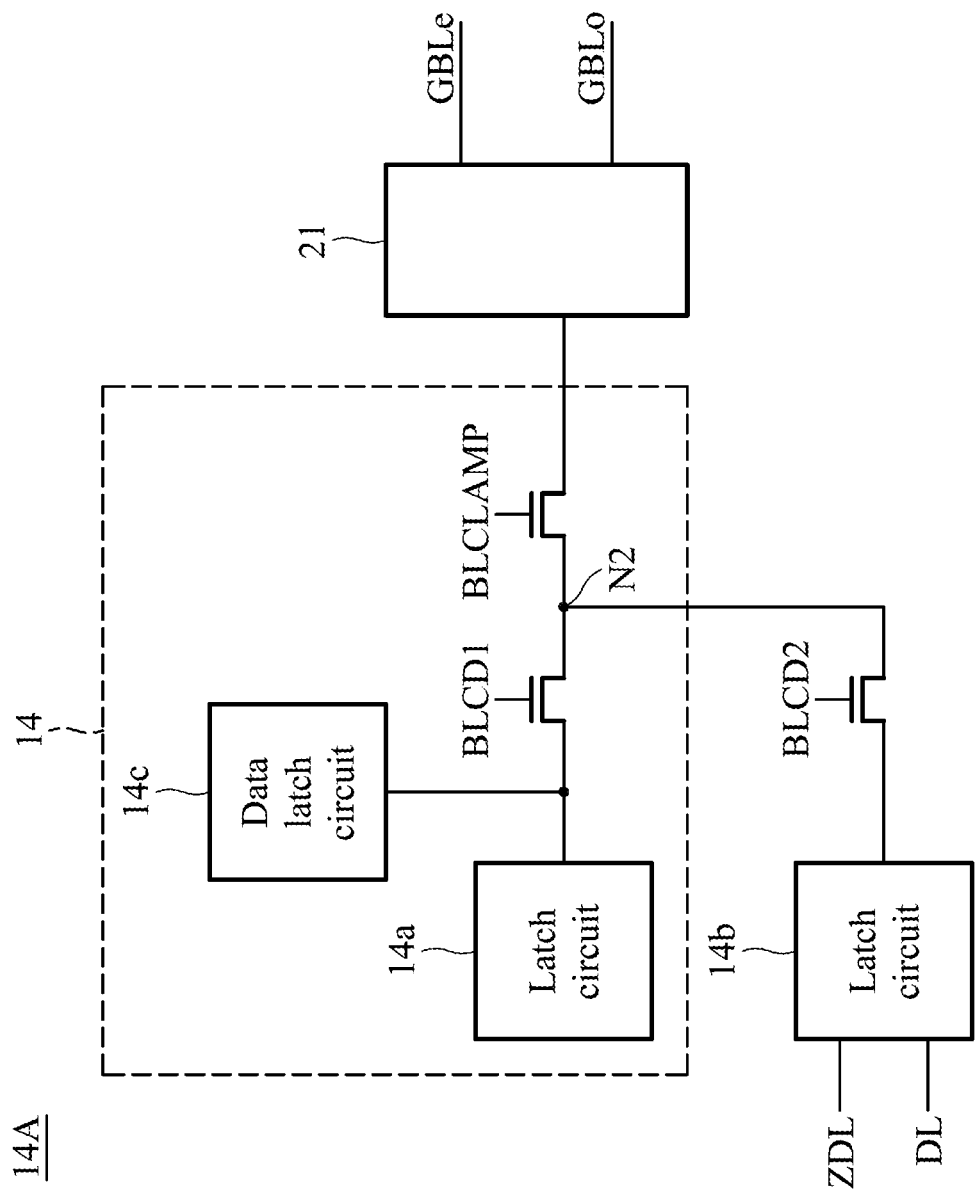
FIG. 14B is a circuit diagram which is simplified from the circuit diagram in FIG. 14A.

(4) It discloses that the global bit line switch circuit 23 is switching-controlled by the control signals YBLe1, YBLo1, BLSe1, BLSo1 and VIRPWR1. (5) In the page buffer circuit 14, the node N1 (TOBL) is connected to the sense node N2 (SNS) through the MOS transistor Q1 controlled by the control signal BLCLAMP. The sense node N2 is connected to the data latch circuit 14c comprising n selection gate transistors Q4 (controlled by control signals SEL0-SELn respectively) and data latches DL0-DLn connected in series, and also connected to the latch circuit 14a through the MOS transistor Q2 controlled by the control signal BLCD. In addition, the sense node N2 is connected to a predetermined voltage V1 via the MOS transistor Q3 controlled by the pre-charge control signal BLPRE. Furthermore, the data latch circuit 14c in FIG. 4A is different from the circuit shown in FIG. 14A, because the circuit of FIG. 4A is simplified since the repetitive placement of data latch circuit 14c of FIG. 14A is wasted and needless.

In FIG. 4B, the global bit line switch circuit part 25 selectively connects the global bit lines GBLe0 or GBLo0 to the node N1 (TOBL) by switching, and comprises the global bit line switch circuit 22 and MOS transistor Q25 controlled by the control signal BLCN0. In the embodiment, the global bit line switch circuit 22 consists of (1) the MOS transistor Q21 controlled by the control signal YBLe0, (2) the MOS transistor Q22 controlled by the control signal YBLo0, (3) the MOS transistor Q23 controlled by the control signal BLSe0, and (4) the MOS transistor Q24 controlled by the control signal BLSo0. In addition, the control signals for the other global bit line circuits 21, 23 and 24 are different, but the global bit line circuits 21, 23 and 24 have the same composition as the global bit line circuits 22. In addition, according to the circuitry and wiring structure, the MOS transistor Q25 can be substituted with the MOS transistor Q23 controlled by the control signal BLSe0, and the MOS transistor Q24 controlled by the control signal BLSo0. The same can also apply to MOS transistors Q21, 23 and 24.

Regarding to the memory cell array 10 and the peripheral circuits of the NAND-type flash EEPROM having the composition mentioned above and corresponding to the third embodiment, the data read operation, the program operation and the program verification operation are described in the following paragraphs.

Figure 6A:
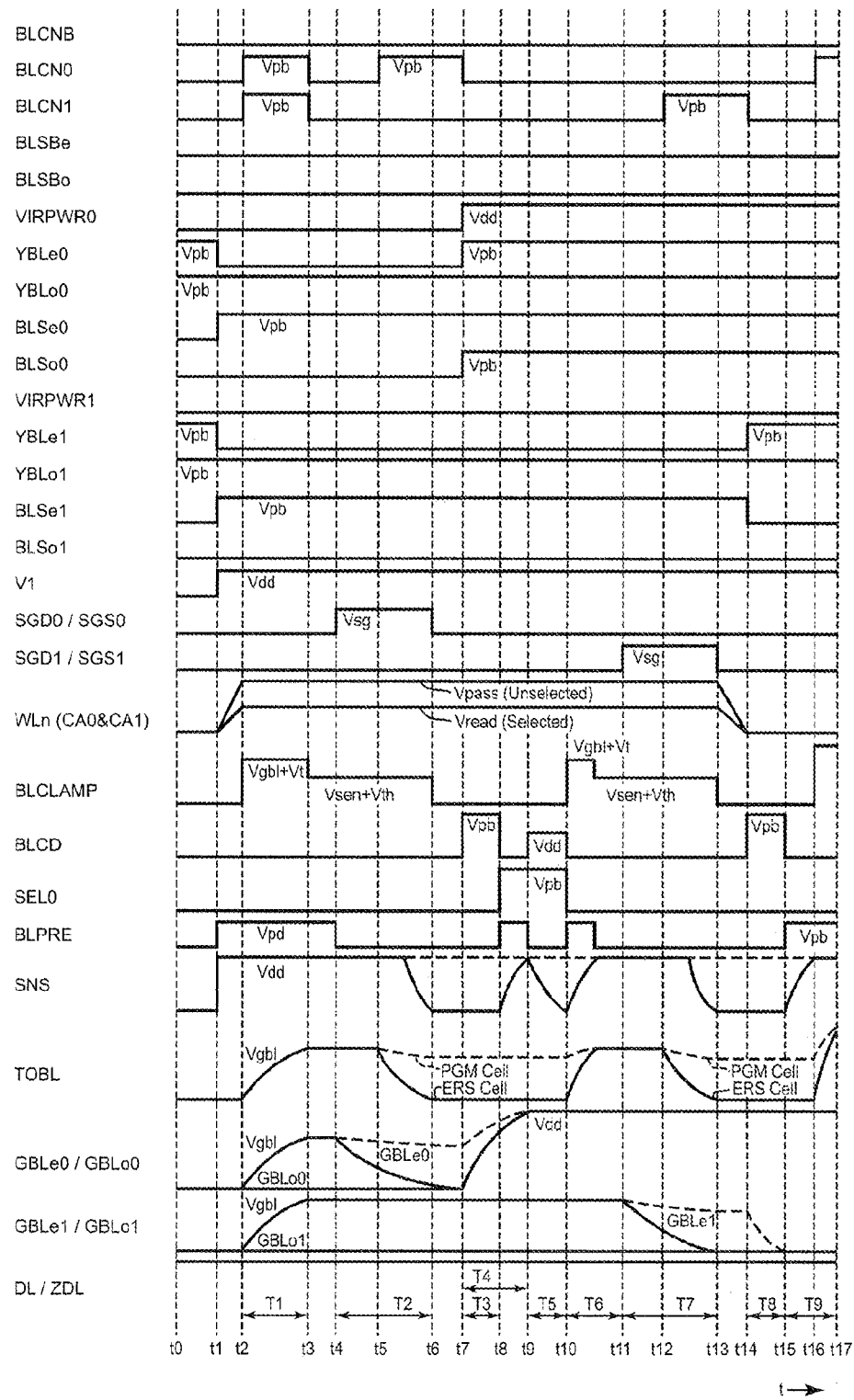
FIG. 6A is a timing chart showing the signals and voltages for a first portion of the read operation to the NAND-type flash EEPROM in FIG. 4A.
Figure 6B:
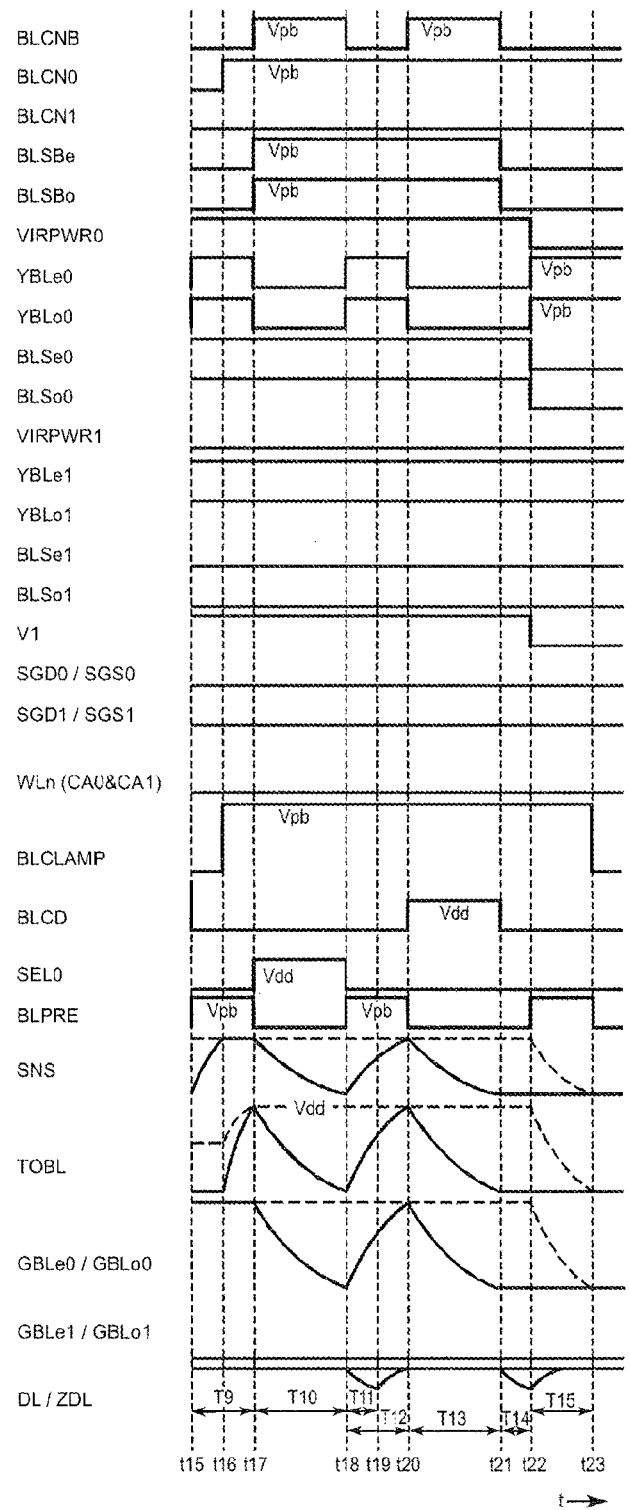
FIG. 6B is a timing chart showing the signals and voltages for a second portion of the read operation to the NAND-type flash EEPROM in FIG. 4A.

FIGS. 6A and 6B are timing charts showing the signals and voltages for the read operation to the NAND-type flash EEPROM in FIG. 4A. The major symbols in the FIGS. 6A-11B are described as follows:
(1) Voltage Vpb: The voltage level for passing the power supply voltage Vdd through the MOS transistor;
(2) Voltage Vdd: The power supply voltage;
(3) Voltage Vss: The ground voltage;
(4) Voltage Vsg: The voltage for turning on the selection gate transistor;
(5) Voltage Vpass (Unselected): The pass voltage for the unselected memory cell;
(6) Voltage Vread (Selected): The read voltage for the selected memory cell;
(7) Voltage Vgb 1+Vt: The summation voltage of the voltage for the global bit lines GBLe0, GBLo0, GBLe1, and GBLo1 and a predetermined voltage Vt;
(8) Voltage Vsen+Vth: The summation voltage of the threshold voltage Vth for MOS transistors and the sense voltage Vsen;
(9) PGM Cell: The programmed cell=the memory cell for data write;
(10) ERS Cell: The erased cell=the memory cell for data erase;
(11) Erase and Inhibit Data: The voltage for maintaining data erase level and inhibiting data write;
(12) Program Data: The voltage for the data write.

The read operations of FIGS. 6A and 6B comprise the following periods T1-T15.

T1 (time t2 to t3): The global bit lines GBLe0, GBLo0, GBLe1 and GBLo1 of both cell arrays CA0 and CA1 are pre-charged in order to read data from the memory cell. In the embodiment, because the global bit lines GBLe0 and GBLe1 are selected as shown, the unselected global bit lines GBLo0 and GBLo1 are fixed in ground voltage Vss. T2 (time t4 to t6): The charges on the global bit line GBLe0 are discharged by the memory cell current (hereinafter referred to as "discharging the global bit line"). T3 (time t7 to t8): The page buffer circuit 14 senses the data of each memory cell of the cell array CA0, and stores it to the latch circuit 14a. T4 (time t7 to t9): The global bit lines GBLe0 and GBLo0 for data transmission are pre-charged. This is performed in the background by using the setting time of periods T3 and T5. T5 (time t9 to t10): The data sensed in period T3 is transmitted from the latch circuit 14a to the data latch DL0 in the data latch circuit 14c. T6 (time t10 to t11): The data senses of the cell array CA1 are set. T7 (time t11 to t13): The global bit line GBLe1 is discharged by the memory cell current. T8 (time t14 to t15): The page buffer circuit 14 senses the data of each memory cell of the cell array CA1 and stores it to the latch circuit 14a. T9 (time t15 to t17): The preparation to transmit data of the cell array CA0 is set. T10 (time t17 to t18): The data of each memory cell of the cell array CA0 stored in the data latch circuit 14c is transmitted to the latch circuit 14b via the global bit lines GBLe0 and GBLo0. T11 (time t18 to t19): The data of each memory cell of the cell array CA0 is output from the latch circuit 14b to DL and ZDL of data line 52. T12 (time 18 to t20): The data transmission of each memory cell of the cell array CA1 is set. T13 (time t20 to t21): The data of each memory cell of the cell array CA1 stored in the data latch circuit 14a is transmitted to the latch circuit 14b via the global bit lines GBLe0 and GBLo0. T14 (time t21 to t22): The data of each memory cell of the cell array CA1 is output from the latch circuit 14b to DL and ZDL of data line 52. T15 (time t22 to t23): The operations of the circuit in FIG. 4A are reset.

As described above, according to the operations of FIGS. 4A and 4B in the embodiment, it can perform read operations that reads the data stored in each memory cell of the cell arrays CA0 and CA1, and transmits the data to the latch circuit 14b via the global bit lines GBLe0 and GBLo0.

In addition, pre-charging and discharging of the global bit lines and the word lines take reveal microseconds, and the voltage of the other signal or node is on the level of 0.1 microseconds, so that the time period from the sense of the cell array CA0 (period T3) to the discharge start of the global bit line GBLe1 of the cell array CA1 (time t11) is as short as 0.5 to 1 microseconds. Conversely, for the anticipation of this time, it can measure the reduced time by setting the discharge start of the global bit line GBLe1 between time t5 and t6. Therefore, most of the time period of discharge of the global bit lines GBLe1 in the cell array CA1 can be hided.

Figure 7A:
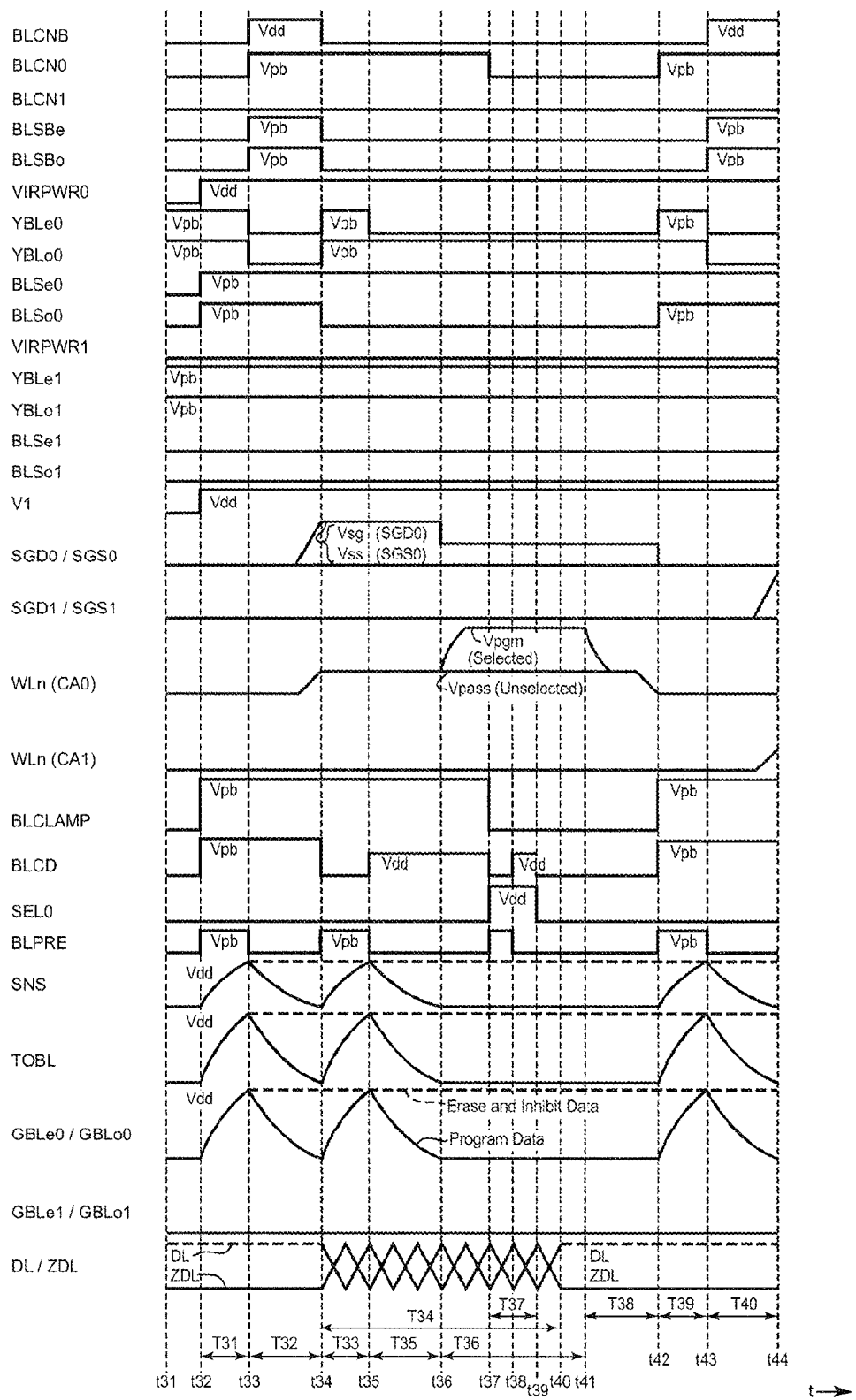
FIG. 7A is a timing chart showing the signals and voltages for a first portion of the program operation to the NAND-type flash EEPROM in FIG. 4A.
Figure 7B:
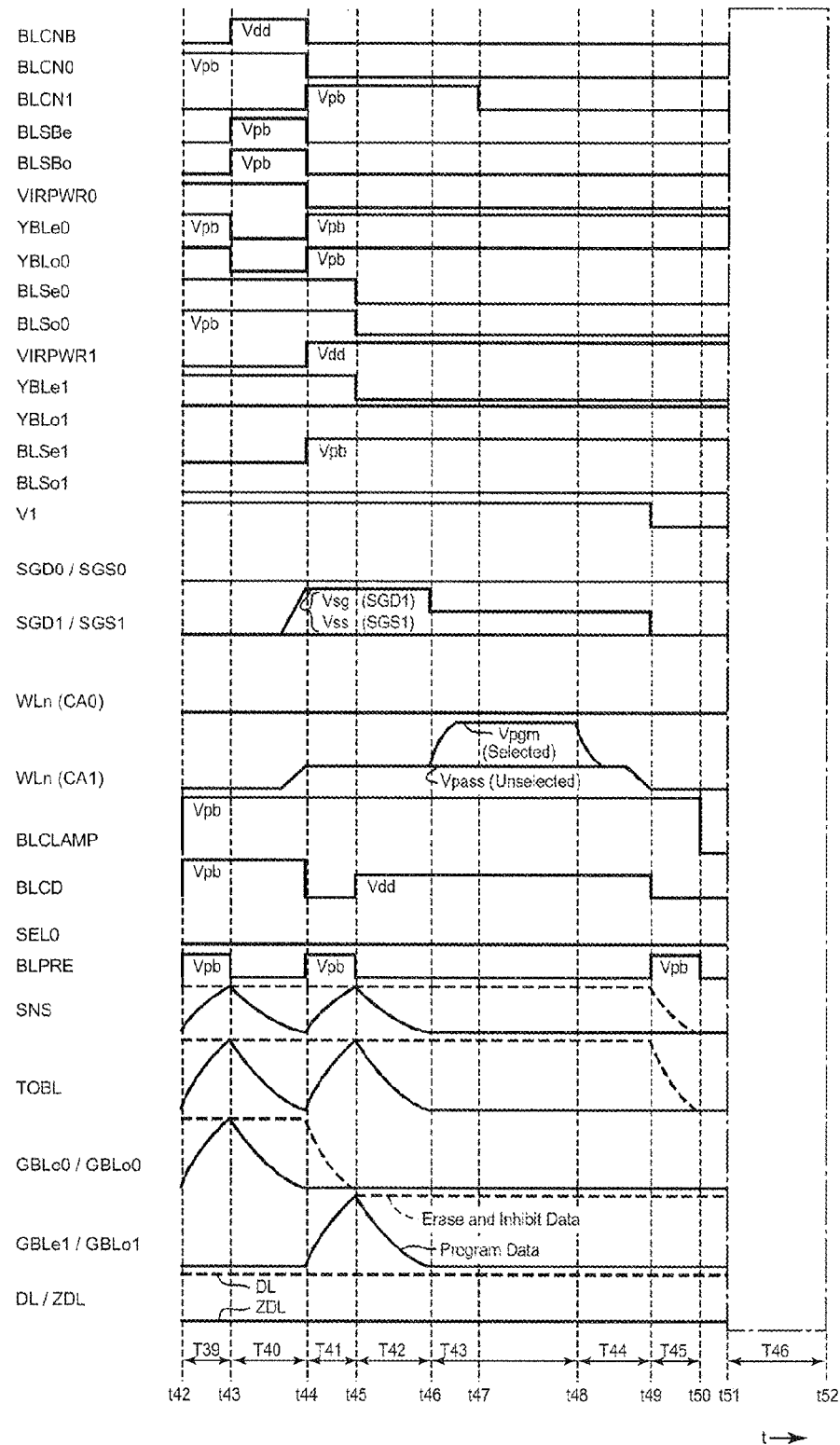
FIG. 7B is a timing chart showing the signals and voltages for a second portion of the program operation to the NAND-type flash EEPROM in FIG. 4A.

FIGS. 7A and 7B are timing charts showing the signals and voltages for the program operation of the NAND-type flash EEPROM in FIG. 4A. The program operations of FIGS. 7A-1, 7A-2, 7A-3, 7B-1, 7B-2 and 7B-3 comprise the following periods, T31-T46. Also, in the embodiment, because the global bit lines GBLe0 and GBLe1 are selected as shown, the unselected global bit lines GBLo0 and GBLo1 are fixed in power source voltage Vdd while a high voltage is applied to the word line by the program operation.

T31 (time t32 to t33): The global bit lines GBLe0 and GBLo0 are pre-charged in order to transmit the input data to each memory cell of the cell array CA0. T32 (time t33 to t34): The data in the latch circuit 14b is transmitted to the latch circuit 14a via the global bit lines GBLe0 and GBLo0. T33 (time t34 to t35): The global bit lines GBLe0 and GBLo0 are pre-charged in order to program each memory cell of the cell array CA0. T34 (time t34 to t40): For programming each memory cell of the cell array CA1 the data to be programmed is transmitted from the peripheral circuits of FIG. 4A to the latch circuit 14b. T35 (time t35 to t36): The page buffer circuit 14 inputs the data stored in the latch circuit 14a into the global bit line GBLe0 being selected and connected with each memory cell of the cell array CA0. T36 (time t36 to t41): The data programming is performed for each memory cell of the cell array CA0 by using program pulse. T37 (time t37 to t39): The data of the programming for each memory cell of the cell array CA0 is transmitted to the latch circuit 14c. T38 (time t41 to t42): The word lines WL0-WLn connected with each memory cell of the cell array CA0 are reset. T39 (time t42 to t43): The global bit lines GBLe0 and GBLo0 are pre-charged in order to transmit data to each memory cell of the cell array CA1 T40 (time 43 to t44): The data stored in the latch circuit 14b is transmitted to the latch circuit 14a via the global bit lines GBLe0 and GBLo0. T41 (time t44 to t45): The global bit lines GBLe1 and GBLo1 are pre-charged in order to program each memory cell of the cell array CA1. T42 (time t45 to t46): The page buffer circuit 14 inputs the data stored in the latch circuit 14a into the global bit line GBLe1 being selected and connected with each memory cell of the cell array CA1 T43 (time t46 to t48): The data program is performed for each memory cell of the cell array CA1 by using program pulse. T44 (time t48 to t49): The word lines WL0-WLn connected with each memory cell of the cell array CA1 are reset. T45 (time t49 to t50): The program operation mentioned above are reset. T46 (time t51 to t52): A program verification is performed for each memory cell of the cell arrays CA0 and CA1, a judgment process is performed for each memory cell in the cell arrays CA0 and CA1, and each of the remaining programs is continued or the end operation is performed. In addition, before the program verification of the cell array CA1, a pre-read (preceding read) from each memory cell of the cell array CA1 is performed, as the characteristic (5) of the parallel programming of the circuit of FIG. 2 described above.

As described above, according to the embodiment of the operations depicted in FIGS. 7A and 7B, the data to be programmed for each memory cell of each of the cell arrays CA0 and CA1 are transmitted from each latch circuit 14b to the latch circuit 14a via the global bit line GBLe0 and GBLo0, and the page buffer circuit 14 can sequentially program data for each memory cell of each of the cell arrays CA0 and CA1.

In FIGS. 7A and 7B, the state of proceeding to the program of the cell array CA1 at the time of the end of the program of the cell array CA0 is illustrated. For example, after the data for the cell array CA0 is transmitted to the data latch circuit 14a, the data is immediately stored into the data latch circuit 14c, and then the data for the cell array CA1 is transmitted to the data latch circuit 14a, so the programs of the cell arrays are started. Further, in this case, in order to perform the program of the cell array CA1 first, the sequence of pre-charging the global bit line GBLe1 and GBLo1 and reflecting the write data transmitted in the latch circuit 14a to the global bit line GBLe1 are advanced, but the program operations of the cell array CA0 and CA1 can be performed almost simultaneously by advancing the sequence of the program of beginning the pre-charge of the global bit lines GBLe0, GBLo0 of the cell array CA0 is advanced just after the pre-charge of the global bit lines GBLe1 and GBLo1 of the cell array CA1 has finished, and. Of course the global bit lines GBLe0, GBLo0, GBLe1 and GBLo1 can be pre-charged at the same time, but the large current is not preferable. In addition, the pre-charge and discharge of the global bit lines take a several microseconds, the width of the program pulse is 10 to 30 microseconds, and each other step takes about 0.1 microseconds, so the parallel writing can be accomplished in this sequence.

Figure 8A:
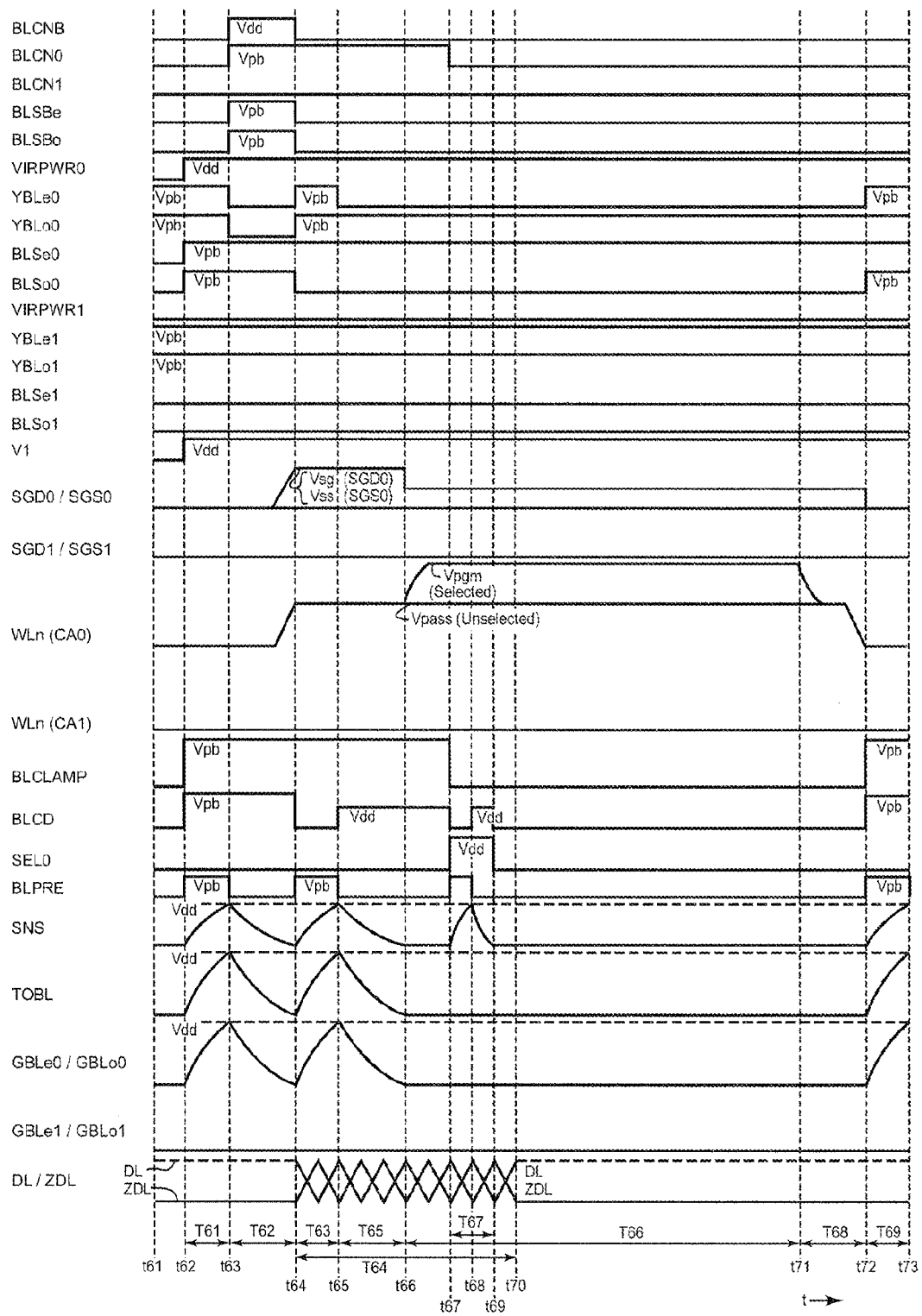
FIG. 8A is a timing chart showing the signals and voltages for a first portion of the program verification operation to the NAND-type flash EEPROM in FIG. 4A.
Figure 8B:
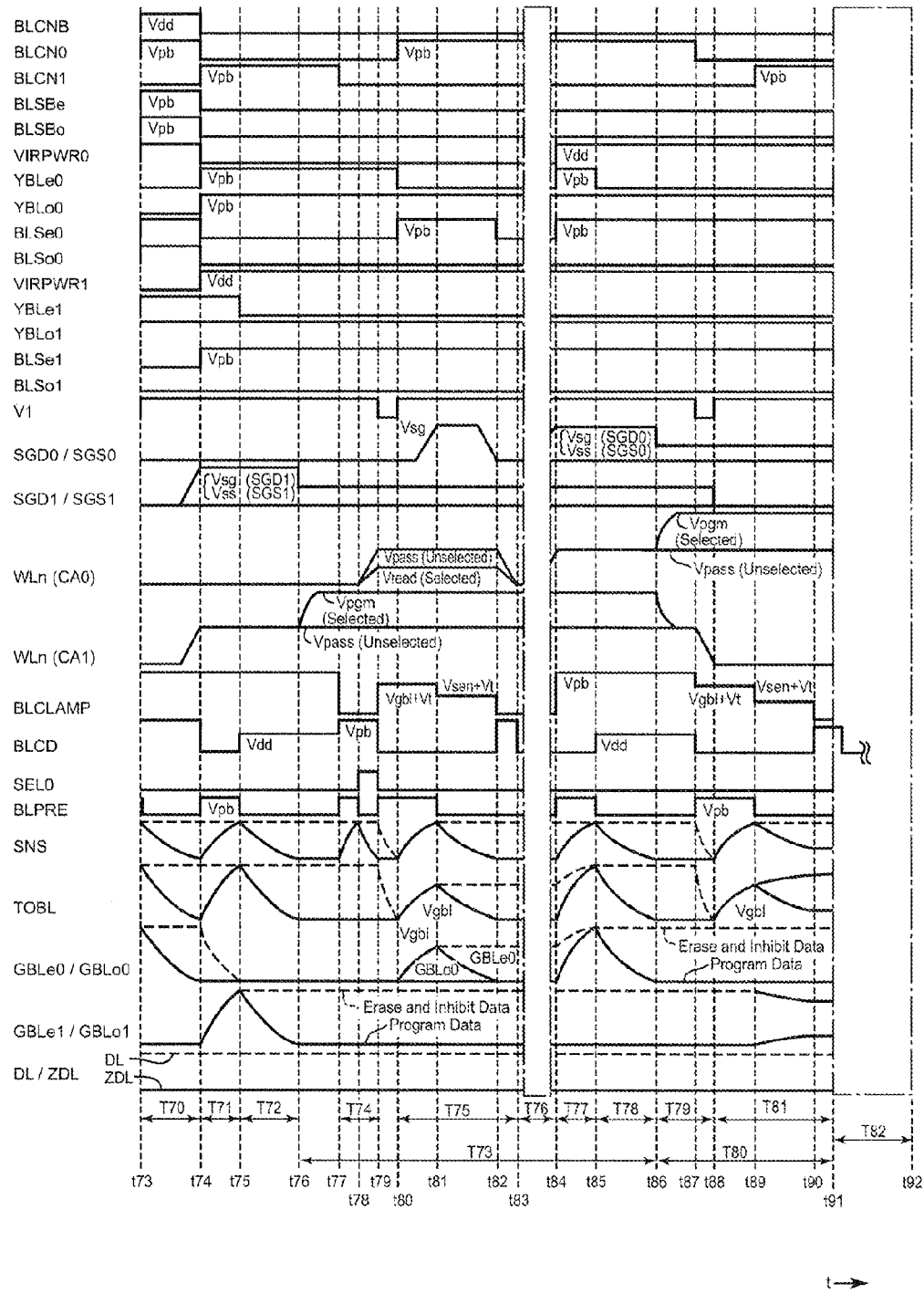
FIG. 8B is a timing chart showing the signals and voltages for a second portion of the program verification operation to the NAND-type flash EEPROM in FIG. 4A.

FIGS. 8A and 8B are timing charts showing the signals and voltages for the program verification operation to the NAND-type flash EEPROM in FIG. 4A. The program operations of FIGS. 8A-1, 8A-2, 8A-3, 8B-1, 8B-2 and 8B-3 comprise the following periods, T61-T83.

T61 (time t62 to t63): The global bit lines GBLe0 and GBLo0 are pre-charged in order to transmit the input data to each memory cell of the cell array CA0. T62 (time t63 to t64): The data in the latch circuit 14b is transmitted to the latch circuit 14a via the global bit lines GBLe0 and GBLo0. T63 (time t64 to t65): The global bit lines GBLe0 and GBLo0 are pre-charged in order to set the program data for each memory cell of the cell array CA0. T64 (time t64 to t70): For programming each memory cell of the cell array CA1 this is the period in which the data to be programmed is transmitted from the peripheral circuits of FIG. 4A to the latch circuit 14b. T65 (time t65 to t66): The page buffer circuit 14 inputs the data stored in the latch circuit 14a into the global bit line GBLe0 or GBLo0 being selected and connected with each memory cell of the cell array CA0. T66 (time t66 to t71): The data program is performed for each memory cell of the cell array CA0 by using program pulse. T67 (time t67 to t69): The data to be programmed for each memory cell of the cell array CA0 is transmitted to the data latch circuit 14c. T68 (time t71 to t72): The word lines WL0-WLn connected with each memory cell of the cell array CA0 are reset. T69 (time t72 to t73): The global bit lines GBLe0 and GBLo0 are pre-charged in order to transmit data to each memory cell of the cell array CA1 T70 (time t73 to t74): The data stored in the latch circuit 14b is transmitted to the latch circuit 14a via the global bit lines GBLe0 and GBLo0. T71 (time t74 to t75): The global bit lines GBLe1 and GBLo1 are pre-charged in order to set the program for each memory cell of the cell array CA1 T72 (time t75 to t76): The page buffer circuit 14 inputs the data stored in the latch circuit 14a into the global bit line GBLe1 or GBLo1 being selected and connected to each memory cell of the cell array CA1 T73 (time t76 to t86): The data program is performed for each memory cell of the cell array CA1 by using program pulse. T74 (time t77 to t79): After the cell array CA1 is isolated (programming is continued) by using the signal BLCN1 to turn off the global bit line switch Q13 at time t77, the data to be programmed into each memory cell of the cell array CA0 are transmitted from the data latch circuit 14c to the latch circuit 14a. T75 (time t80 to t83): The program verification (including read operation) for each memory cell of the cell array CA0 is performed. T76 (time t83 to t84): The judgment process for the data in each memory cell of the cell array CA0 is performed. T77 (time t84 to t85): The global bit lines GBLe0 and GBLo0 are pre-charged in order to input the program data to each memory cell of the cell array CA0. T78 (time t85 to t86): The page buffer circuit 14 inputs the data stored in the latch circuit 14a into the global bit line GBLe0 or GBLo0 being selected and connected with each memory cell of the cell array CA0. T79 (time t86 to t88): The word lines WL0-WLn connected with each memory cell of the cell array CA1 are reset. T80 (time t86 to t91): The data program is performed for each memory cell of the cell array CA0 by using program pulse. T81 (time t88 to t91): For program verification for the data in each memory cell of the cell array CA1 and its judgment process, the data from the global bit line GBLe1 or GBLo1 is pre-read (preceding read) to the latch circuit 14a. T82 (time t91 to t92): The program verification and judgment process for each memory cell of the cell array CA1 are performed.

As described above, according to the operations of the embodiments of FIGS. 8A and 8B, sequential program verification for each of the memory cells of the cell arrays CA0 and CA1 can be performed. In the embodiment, the program verification for the cell array CA0 is performed during the programming of the cell array CA1, and the program verification for the cell array CA1 is performed during the programming of the cell array CA0, such that there is a feature of apparent eliminating the time for program verification. In addition, in the embodiment, there is no need to mention that of course a modification can put the program or verification into a sequential sequence simultaneously, after loading the data written in the cell arrays CA0 and CA1 into the page buffer 14.

Fourth Embodiment

Figure 5A:
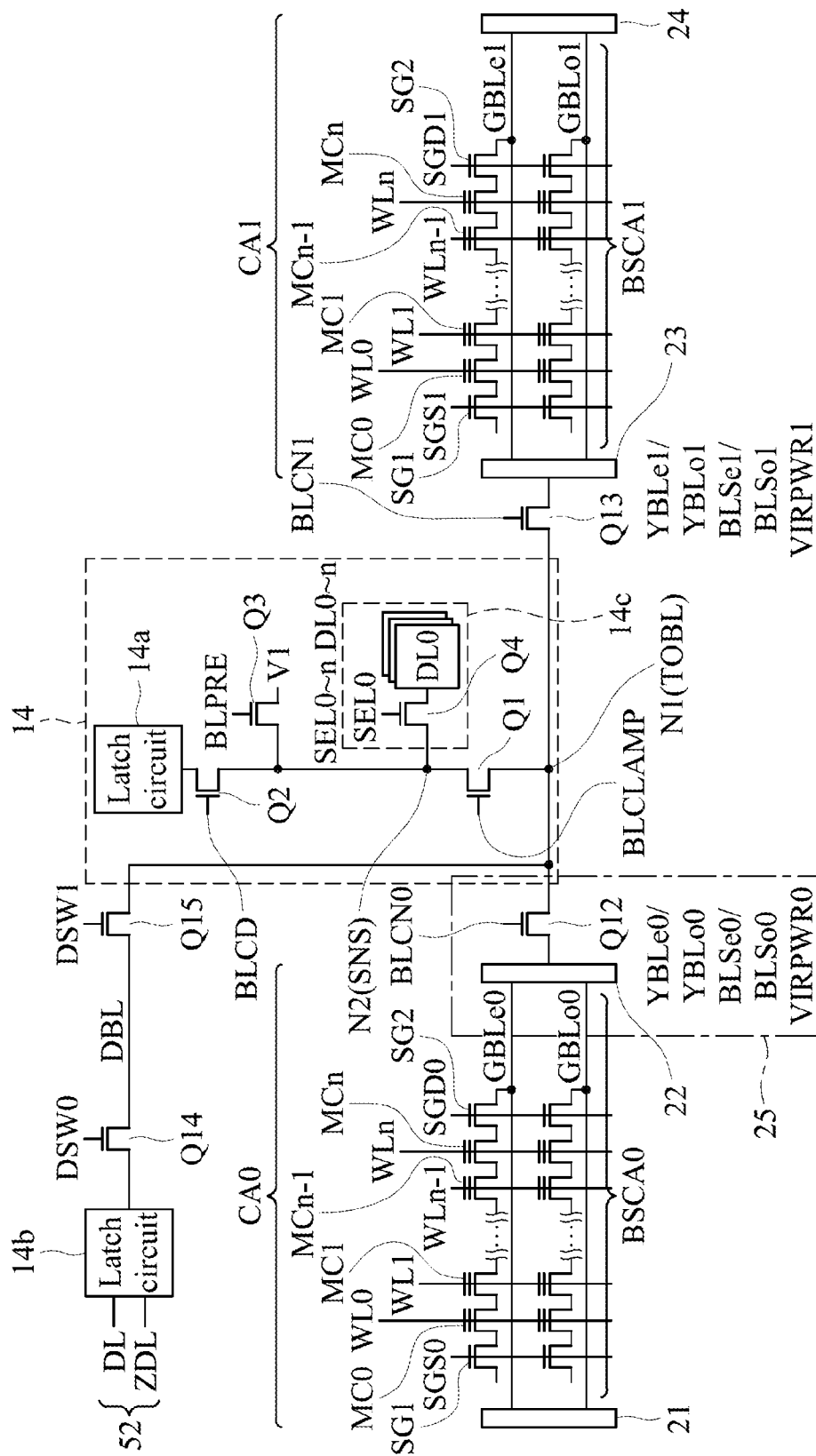
FIG. 5A is a circuit diagram illustrating a memory cell array 10 and the peripheral circuits of the NAND-type flash EEPROM according to a fourth embodiment of the invention.

FIG. 5A is a circuit diagram illustrating a memory cell array 10 and the peripheral circuits of the NAND-type flash EEPROM according to a fourth embodiment of the invention. In the embodiment, the fourth embodiment is the specific example concretely illustrating a circuit of the second embodiment.

There are the following differences of the circuit in FIG. 5A in comparison with the circuit in FIG. 4A: (1) for the multiple layers of the device, the data bit line DBL connecting the node N1 and the latch circuit 14b is installed in the layer higher than the layer of the memory cell. In the embodiment, the two layers can be connected via the via-conductor. The differences are described in the following paragraphs.

In FIG. 5A, the latch circuit 14b is connected to the node N1 through the MOS transistor Q14 controlled by the control signal DSW0, the data bit line DBL and the MOS transistor Q15 controlled by the control signal DSW1. Because the data bit line is constituted by a metal line wider than the global bite line GBL, there is no load for the connection via the memory cell and the global bit line GBL, so that the speed limit can be very relaxed. Therefore, for the data transmission, there are special effects that the parallel program and parallel read operations are simple sequences in comparison with the circuit of FIG. 3A, and the transmission speed becomes higher.

Figure 9A:
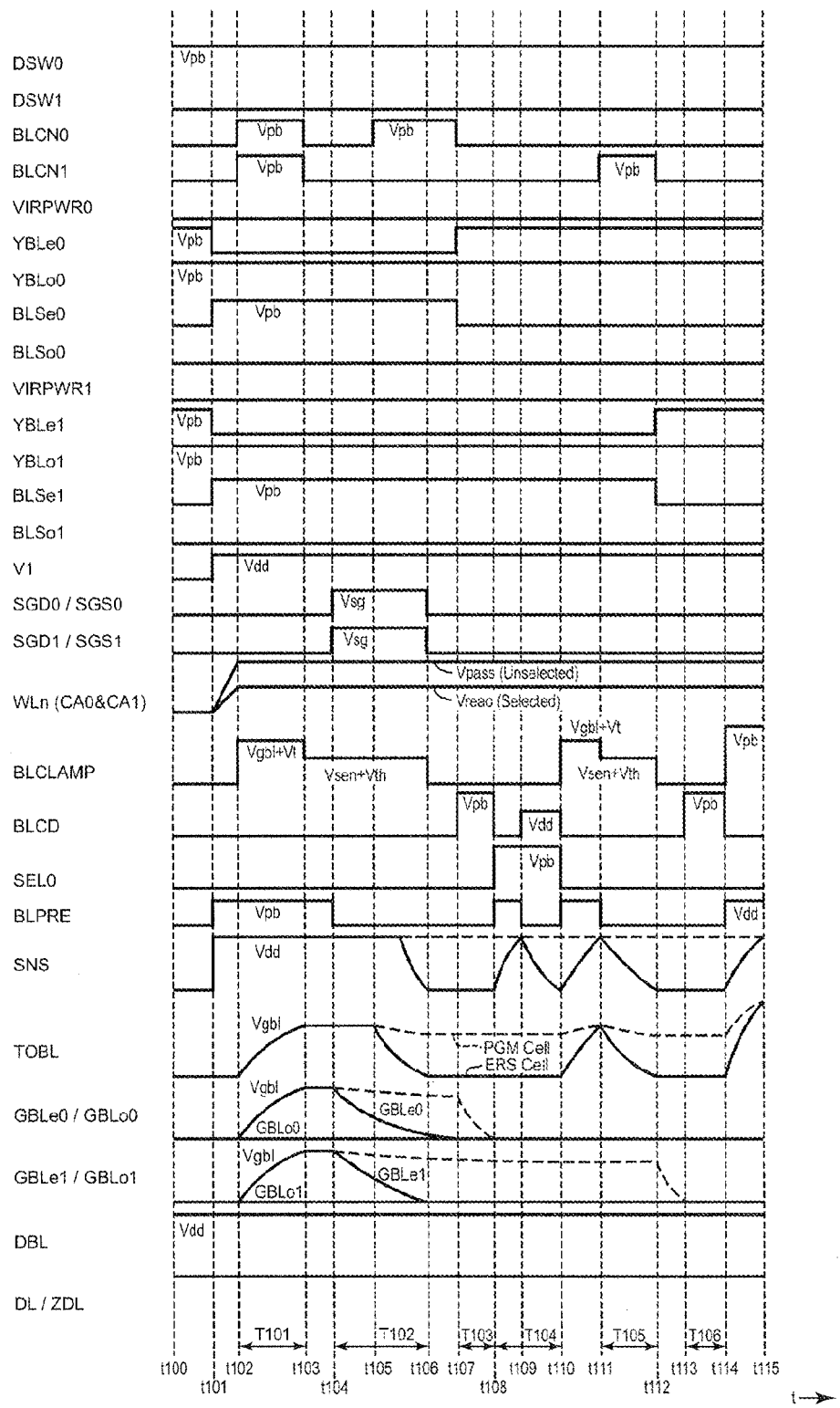
FIG. 9A is a timing chart showing the signals and voltages for a first portion of the read operation to the NAND-type flash EEPROM in FIG. 5A.
Figure 9B:
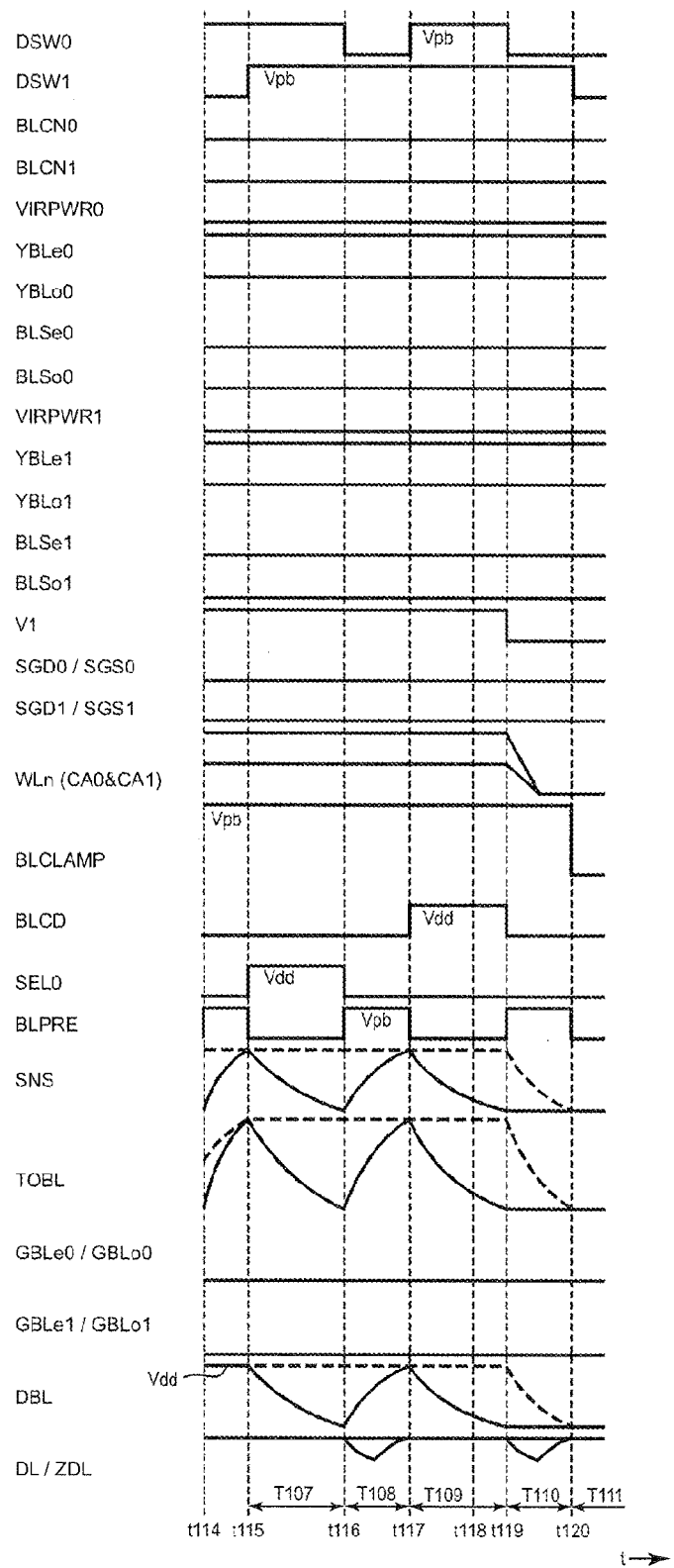
FIG. 9B is a timing chart showing the signals and voltages for a second portion of the read operation to the NAND-type flash EEPROM in FIG. 5A.

FIGS. 9A and 9B are timing charts showing the signals and voltages for the read operation to the NAND-type flash EEPROM in FIG. 5A. The read operations of FIGS. 9A and 9B comprise the following periods T101-T111. In addition, the data bit line DBL is pre-charged by the power source voltage Vdd.

T101 (time t102 to t103): The global bit lines GBLe0, GBLo0, GBLe1 and GBLo1 of both cell arrays CA0 and CA1 are pre-charged in order to read data from the memory cell. In addition, in the embodiment, because the global bit lines GBLe0 and GBLe1 are selected as shown, the unselected global bit lines GBLo0 and GBLo1 are fixed in ground voltage Vss. T102 (time t104 to t106): The global bit lines GBLe0 and GBLe1 are discharged by the memory cell current. T103 (time t107 to t108): The page buffer circuit 14 senses the data of each memory cell of the cell array CA0, and stores it to the latch circuit 14a. T104 (time t108 to t110): The data sensed in period T103 is transmitted from the latch circuit 14a to the data latch DL0 in the data latch circuit 14c. T105 (time t111 to t112): The data from each memory cell of the cell array is transmitted from the global bit line GBLe1 to the page buffer circuit 14. T106 (time t113 to t114): The page buffer circuit 14 senses the data of each memory cell of the cell array CA1, and stores it to the latch circuit 14a. T107 (time t115 to t116): The data of each memory cell of the cell array CA0 stored in the data latch DL0 of the data latch circuit 14c is transmitted from the data latch DL0 to the latch circuit 14b via the data bit line DBL. T108 (time t116 to t117): The data of each memory cell of the cell array CA0 is output from the latch circuit 14b to DL and ZDL of data line 52. T109 (time t117 to t119): The data of each memory cell of the cell array CA1 stored in the data latch circuit 14a is transmitted to the latch circuit 14b via the data bit line DBL. T110 (time t119 to t120): The data of each memory cell of the cell array CA1 is output from the latch circuit 14b to DL and ZDL of data line 52. T111 (after time t120): The above read operations are reset.

As described above, according to the operations of FIGS. 4A and 4B in the embodiment, it can perform read operations that read the data stored in each memory cell of the cell arrays CA0 and CA1 and transmit the data to the latch circuit 14b via the data bit line DBL. In addition, in the embodiment, the simultaneous pre-charge and simultaneous discharge for the selected global bit lines GBLe0 and GBLe1 are performed. Therefore, the time periods from discharging to sensing for the cell arrays CA0 and CA1 are different, but it is easy to modify them same time period by shifting the timing of them a little in consideration of the number of operation steps.

Figure 10A:
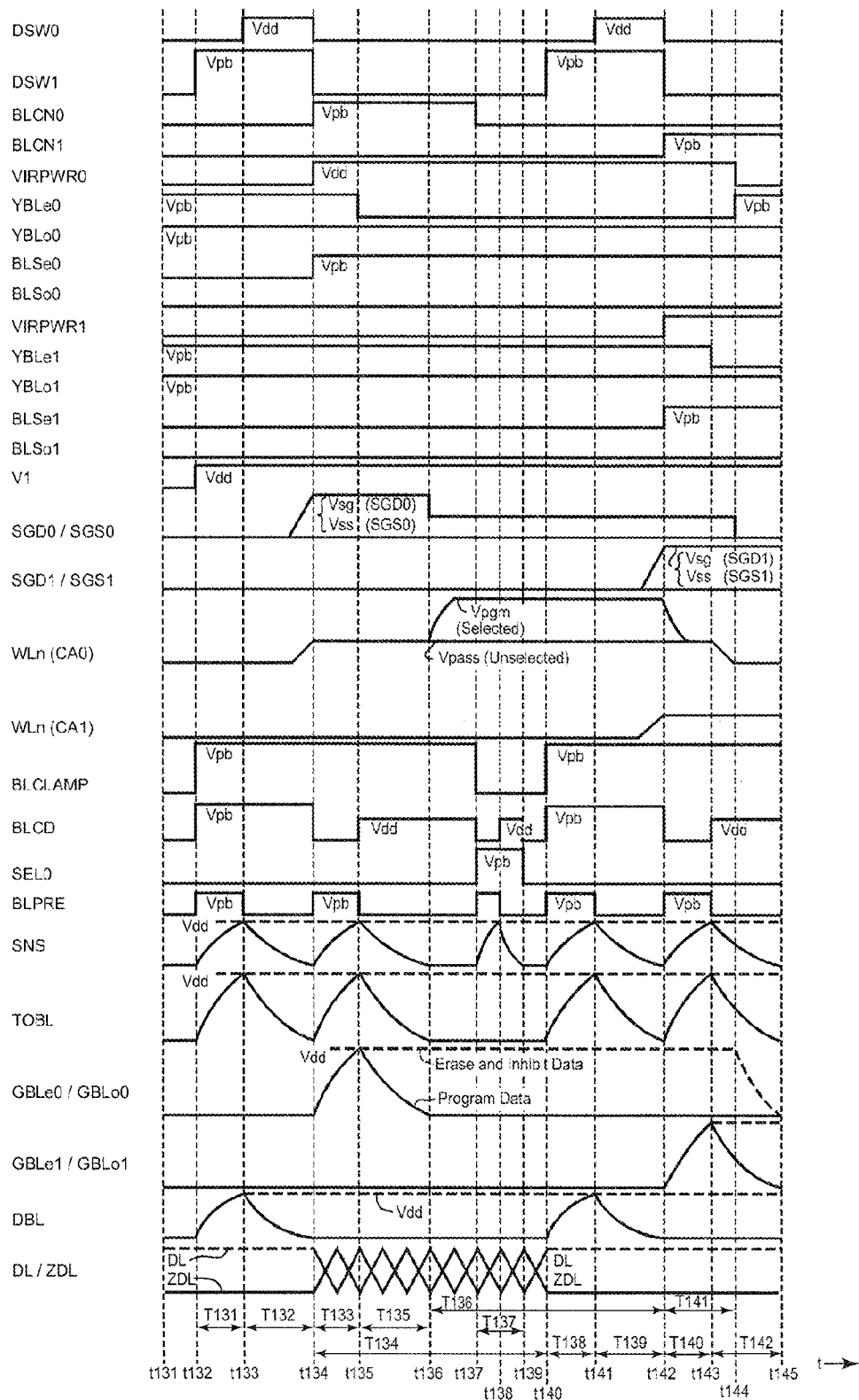
FIG. 10A is a timing chart showing the signals and voltages for a first portion of the program operation to the NAND-type flash EEPROM in FIG. 5A.
Figure 10B:
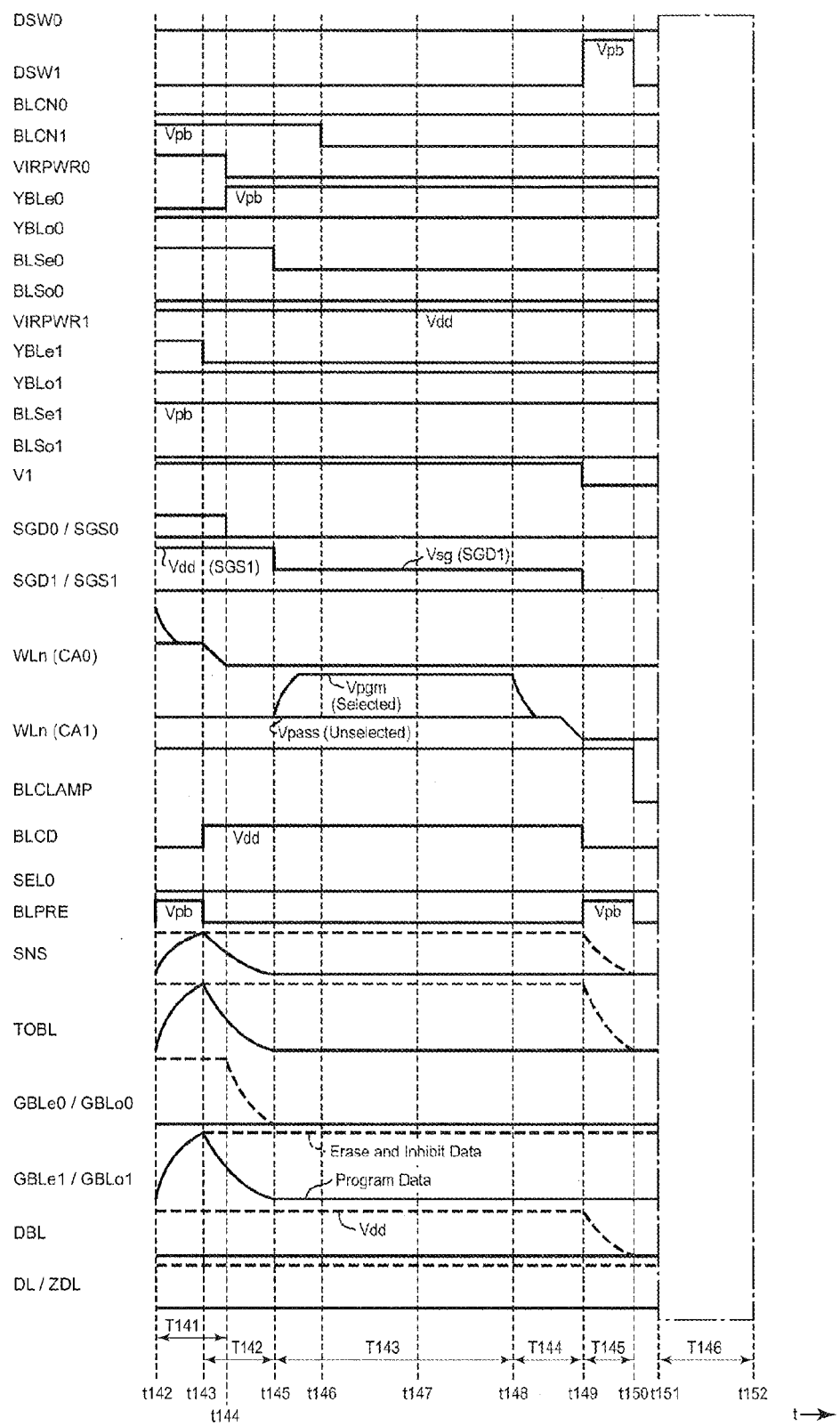
FIG. 10B is a timing chart showing the signals and voltages for a second portion of the program verification operation to the NAND-type flash EEPROM in FIG. 5A.

FIGS. 10A and 10B are timing charts showing the signals and voltages for the program operation to the NAND-type flash EEPROM in FIG. 5A. The program operations of FIGS. 10A and 10B comprise the following periods, T131-T146.

T131 (time t132 to t133): The data bit line DBL is pre-charged in order to transmit the input data to each memory cell of the cell array CA0. T132 (time t133 to t134): The data in the latch circuit 14b to be programmed into each memory cell of the cell array CA0 is transmitted to the latch circuit 14a via the data bit line DBL. T133 (time t134 to t135): The global bit lines GBLe0 and GBLo0 are pre-charged in order to program for each memory cell of the cell array CA0. T134 (time t134 to t140): For programming each memory cell of the cell array CA1 it is the period that the data to be programmed is transmitted from the peripheral circuits of FIG. 5A to the latch circuit 14b. T135 (time t135 to t136): The page buffer circuit 14 inputs the data stored in the latch circuit 14a into the global bit line GBLe0 or GBLo0 being selected and connected with each memory cell of the cell array CA0. T136 (time t136 to t142): The data program is performed for each memory cell of the cell array CA0 by using program pulse. T137 (time t137 to t139): The data to be programmed for each memory cell of the cell array CA0 is transmitted to the data latch circuit 14c. T138 (time t140 to t141): The data bit line DBL is pre-charged in order to transmit the input data for each memory cell of the cell array CA1 T139 (time t141 to t142): The data in the latch circuit 14b to be programmed into each memory cell of the cell array CA1 is transmitted to the latch circuit 14a via the data bit line DBL. T140 (time t142 to t143): The global bit lines GBLe1 and GBLo1 are pre-charged in order to set the program for each memory cell of the cell array CA1 T141 (time t142 to t144): The word lines WL0-WLn connected with each memory cell of the cell array CA0 are reset. T142 (time t143 to t145): The page buffer circuit 14 inputs the data stored in the latch circuit 14a into the global bit line GBLe1 or GBLo1 being selected and connected with each memory cell of the cell array CA1 T143 (time t145 to t148): The data program is performed for each memory cell of the cell array CA1 by using program pulse. T144 (time t148 to t149): The word lines WL0-WLn connected with each memory cell of the cell array CA1 are reset. T145 (time t149 to t150): The above read operations are reset. T146 (time t151 to t152): The program verification is performed for each memory cell of the cell arrays CA0 and CA1, the judgment process is performed for each memory cell in the cell arrays CA0 and CA1, and each of the remaining programs is continued or the end operation is performed. In addition, before the program verification of cell array CA1, a pre-read (preceding read) from each memory cell of the cell array CA1 is performed, as the characteristic (5) of the parallel programming of the circuit of FIG. 2 described above.

As described above, according to the embodiment of operations of FIGS. 10A and 10B, the data to be programmed for each memory cell of each of the cell array CA0 and CA1 are transmitted from each latch circuit 14b to the latch circuit 14a via the data bit line DBL, and the page buffer circuit 14 can sequentially program data for each memory cell of each of the cell arrays CA0 and CA1.

In the embodiment of FIGS. 10A and 10B, the state of proceeding to the program of the cell array CA1 at the time of the end of the program of the cell array CA0 is illustrated, but the period from time t136 to t140 is several microseconds, and the pre-charge for the data bit line DBL of the period T138 and the global bit lines GBLe1 and GBLo1 of the cell array CA1 may begin from time t135. The period T136 for data loading into the cell array CA1 to the latch circuit to 14b from the peripheral circuit is hastened, and after the programming for the cell array CA0 starts for a few microseconds, the data written to the cell array CA1 is transmitted to the data latch circuit 14a, so the programs of the cell arrays CA1 can be moved. The periods T136 or T143 of programming for cell array are considered as 10 to 30 microseconds, and it can be called a "simultaneous program".

Figure 11A:
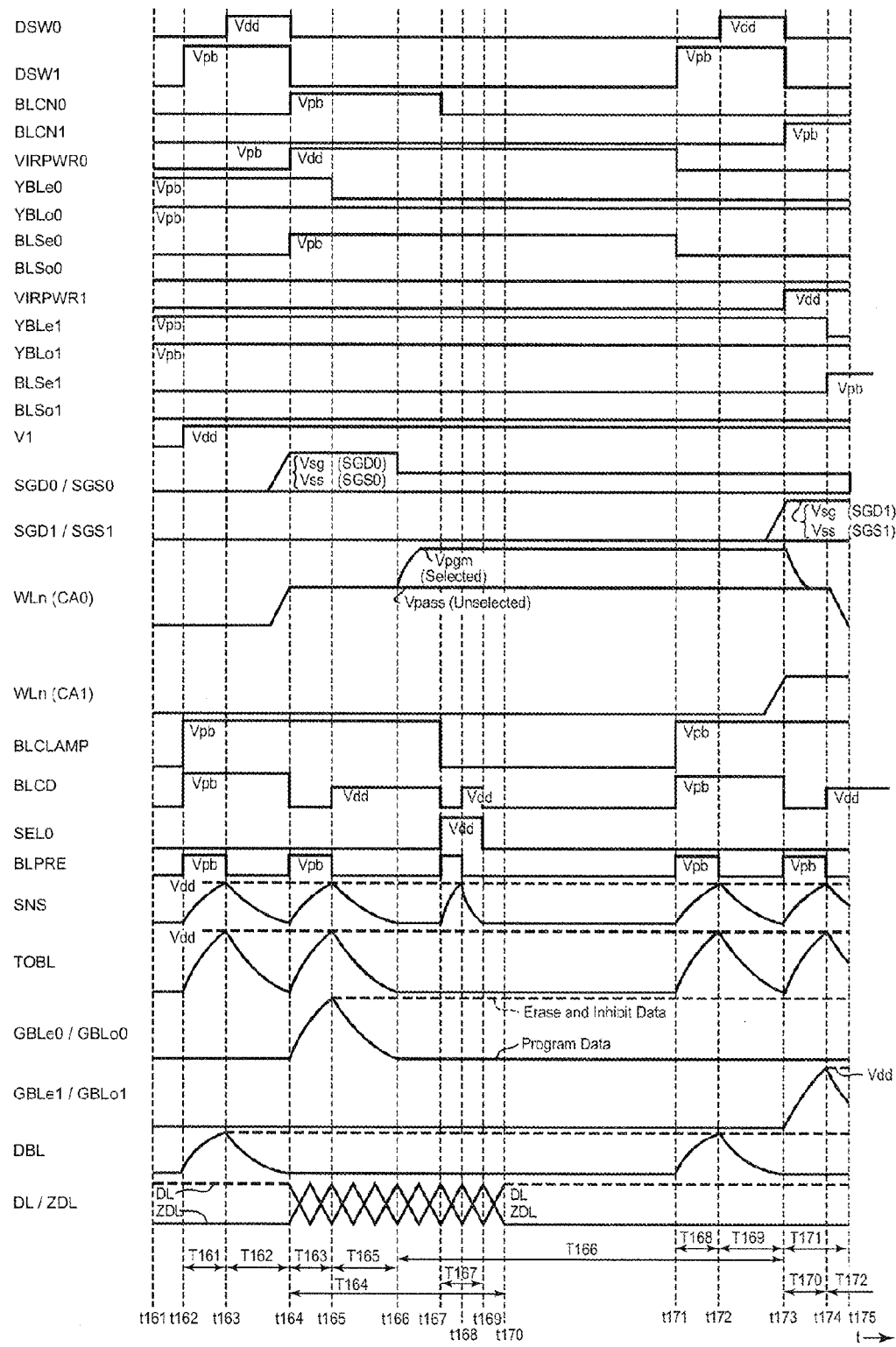
FIG. 11A is a timing chart showing the signals and voltages for a first portion of the program verification operation to the NAND-type flash EEPROM in FIG. 5A.
Figure 11B:
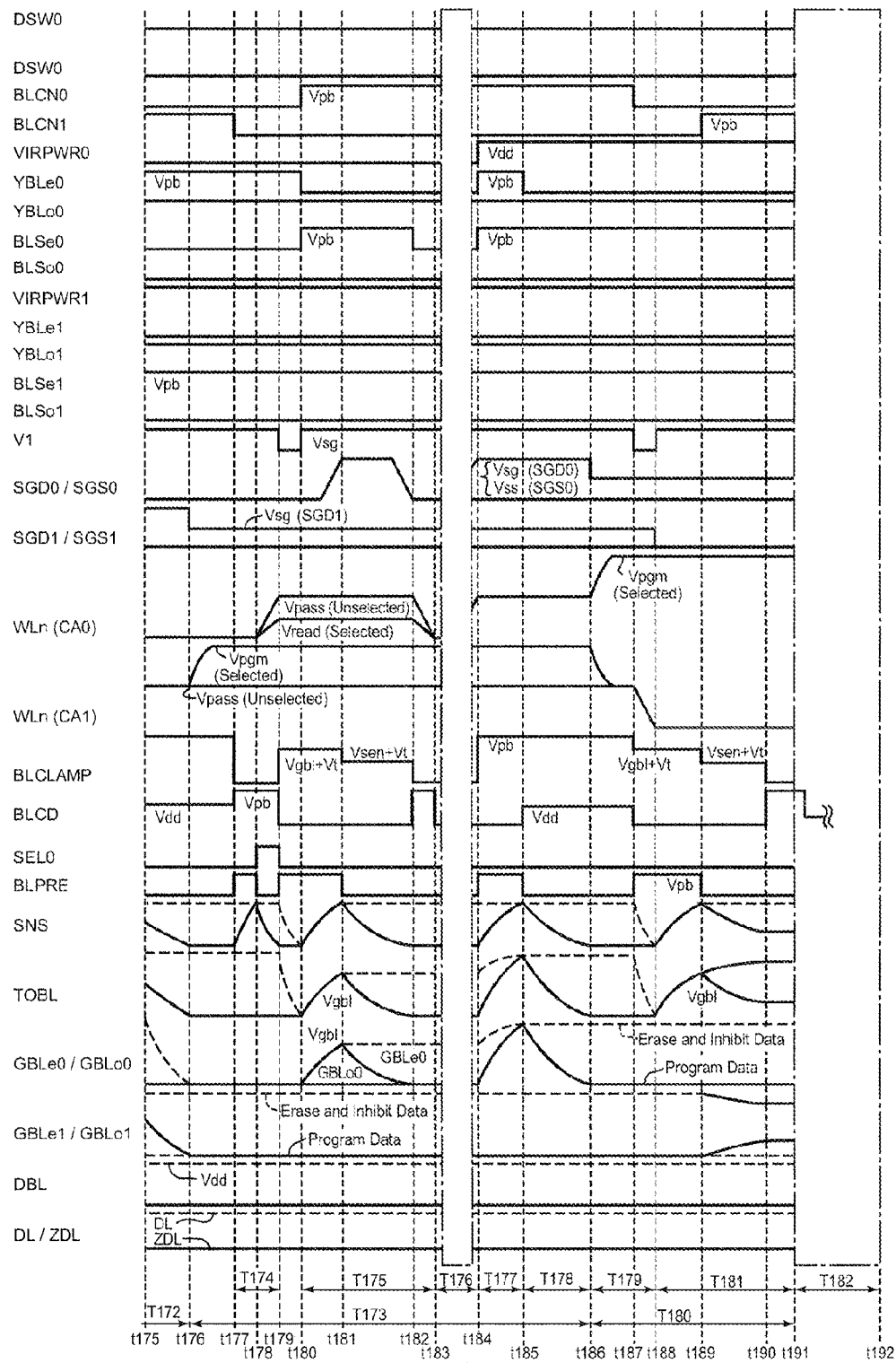
FIG. 11B is a timing chart showing the signals and voltages for a second portion of the program verification operation to the NAND-type flash EEPROM in FIG. 5A.
Figures 12A, 12B:
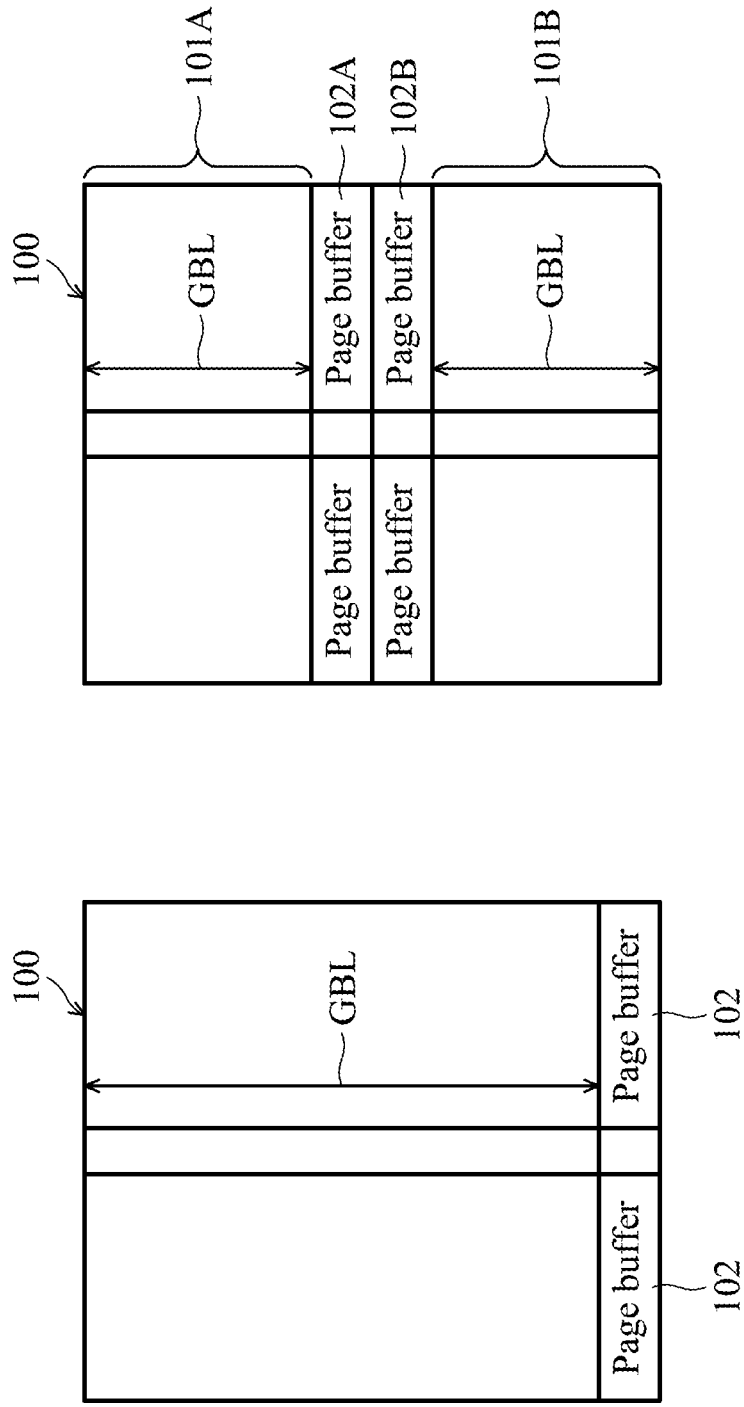
FIG. 12A is a block diagram illustrating a constitution of a NAND-type flash EEPROM related a first conventional embodiment.
FIG. 12B is a block diagram illustrating a constitution of a NAND-type flash EEPROM related a second conventional embodiment.
Figure 13:
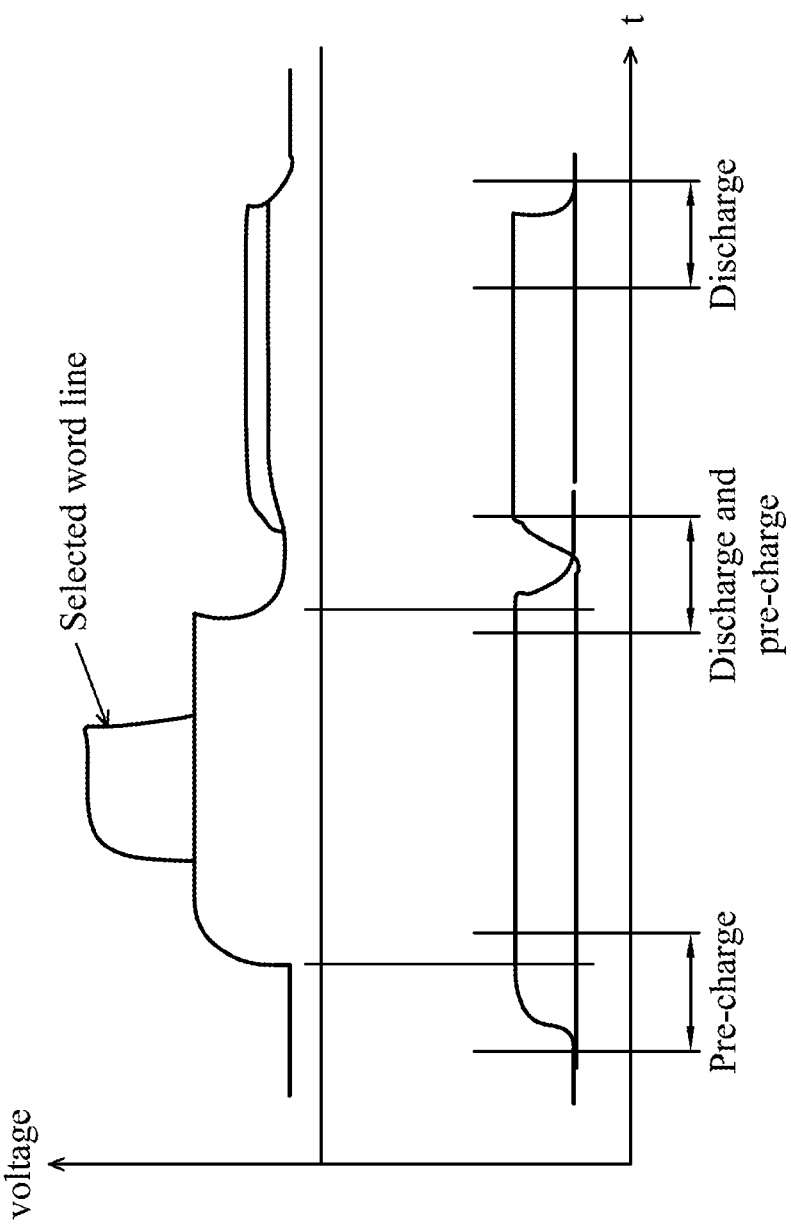
FIG. 13 is a timing chart showing the voltages of the word lines WL and the global lines GBL in order to explain the problem of program speed in the prior art.

FIGS. 11A and 11B are timing charts showing the signals and voltages for the program verification operation to the NAND-type flash EEPROM in FIG. 5A. The read operations of FIGS. 11A and 11B comprise the following periods T161-T183.

T161 (time t162 to t163): The data bit line DBL is pre-charged in order to transmit the input data to each memory cell of the cell array CA0. T162 (time t163 to t164): The data in the latch circuit 14b is transmitted to the latch circuit 14a via the data bit line DBL. T163 (time t164 to t165): The global bit lines GBLe0 and GBLo0 are pre-charged in order to set the program data for each memory cell of the cell array CA0. T164 (time t164 to t170): For programming each memory cell of the cell array CA1 this is the period in which the data to be programmed is transmitted from the peripheral circuits of FIG. 5A to the latch circuit 14b. T165 (time t165 to t166): The page buffer circuit 14 inputs the data stored in the latch circuit 14a into the global bit line GBLe0 or GBLo0 being selected and connected with each memory cell of the cell array CA0. T166 (time t166 to t173): The data program is performed for each memory cell of the cell array CA0 by using program pulse. T167 (time t167 to t169): The data to be programmed for each memory cell of the cell array CA0 is transmitted to the data latch circuit 14c. T168 (time t171 to t172): The data bit line DBL is pre-charged in order to transmit the input data to each memory cell of the cell array CA1 T169 (time t172 to t173): The data in the latch circuit 14b is transmitted to the latch circuit 14a via the data bit line DBL. T170 (time t173 to t174): The global bit lines GBLe1 and GBLo1 are pre-charged in order to set the program data for each memory cell of the cell array CA1 T171 (time t173 to t175): The word lines WL0-WLn connected with each memory cell of the cell array CA0 are reset. T172 (time t174 to t176): The page buffer circuit 14 inputs the data stored in the latch circuit 14a into the global bit line GBLe1 or GBLo1 being selected and connected with each memory cell of the cell array CA1 T173 (time t176 to t186): The data program is performed for each memory cell of the cell array CA1 by using program pulse. T174 (time t177 to t179): After the cell array CA1 is isolated (programming is continued) by turning off the global bit line switch Q13 with the signal BLCN1 at time t177, the data to be programmed into each memory cell of the cell array CA0 are transmitted from the data latch circuit 14c to the latch circuit 14a. T175 (time t180 to t183): The program verification (including read operation) for each memory cell of the cell array CA0 is performed. T176 (time t183 to t184): The judgment process for the data in each memory cell of the cell array CA0 is performed. T177 (time t184 to t185): The global bit lines GBLe0 and GBLo0 are pre-charged in order to input the program data to each memory cell of the cell array CA0. T178 (time t185 to t186): The page buffer circuit 14 inputs the data stored in the latch circuit 14a into the global bit line GBLe0 or GBLo0 being selected and connected with each memory cell of the cell array CA0. T179 (time t186 to t188): The word lines WL0-WLn connected with each memory cell of the cell array CA1 are reset. T180 (time t186 to t191): The data program is performed for each memory cell of the cell array CA0 by using program pulse. T181 (time t188 to t191): For the judgment process and program verification for the data in each memory cell of the cell array CA1, the data from the global bit line GBLe1 or GBLo1 is pre-read (preceding read) to the latch circuit 14a. T182 (time t191 to t192): The program verification and judgment process for each memory cell of the cell array CA1 are performed.

As described above, according to the operations of the embodiments of FIGS. 11A and 11B, sequential program verification for each of the memory cells of the cell arrays CA0 and CA1 can be performed. In addition, the operations of the embodiment are similar to the operation in FIGS. 8A and 8B, the program verification for the cell array CA0 is performed during programming the cell array CA1, and the program verification for the cell array CA1 is performed during programming the cell array CA0, such that there is a feature of apparent eliminating the time for program verification.

In addition, the embodiment increases the flexibility of each signal in the timing setting. In the third or fourth embodiment, when the bit line switches Q11 and Q12 or Q13 are off, each of the global bit lines GBL of the cell array CA0 or CA1 can pre-charge or discharge independently. In addition, in the fourth embodiment, when the data bit line switch Q15 is off, the data of the latch circuit 14b can be introduced to the data bit line DBL independently from the cell arrays CA0, CA1 and the page buffer circuit 14. Conversely, when the data bit line switch Q14 is off, and the data bit line DBL can be used independently from the latch circuit 14b. By using these flexibilities, many modifications of the timing can be accomplished, and it is not limited to the above-mentioned timing.

For each of the embodiments, the parallel operation of the erase operation is described. To erase the selected block of cell array CA0 (referred as to "BLK0n") and the selected block (referred as to "BLK1m") of cell array CA1, it is obvious that the high voltage pulse for erase can be applied at the same time. After the word line of the selected block is 0V, the global bit lines GBL are floating by turning off the global bit line switches 21, 22, 23, 24 and Q11, Q12, Q13, and it may apply the high voltage to the substrate (P-well). Therefore, erase verification is used for the page buffer circuits as well as the program verification, and it is basically similar to the read operation, so that the approximately simultaneous parallel operation is possible. After the cell arrays CA0 and CA1 are pre-charged simultaneously, and the status of each memory is reflected to the global line GBL, it continues the data sensing of the cell array CA0 and the data storage to the latch circuit 14c, and the data sensing of the cell array CA1 and the data storage of the latch circuit 14a by the time-division. The judgment of the erase end can be performed after the storage to the latch circuit or after the sensing.

As described above, the parallel operation of erasing can be performed, whereas the erase pulse is several hundred microseconds to 1 millisecond, and the verification and judgment take about 10 microseconds, so that it is almost a perfect parallel operation.

In the above-mentioned embodiments, a NAND-type flash EEPROM is described, but the invention is not limited thereto. The invention can also be applied to a rewritable nonvolatile semiconductor storage device, such as a NOR type flash EEPROM.

The above-mentioned embodiments are configured by a pair of global bit lines GBLe and GBLo, but the invention is not limited thereto. It can be configured by using one global bit line GBL.

In the above-mentioned embodiments, the control circuit 11 may control performing at least one of the data writing, data reading, and data erasing for the cell arrays CA0 and CA1 by time division. In the embodiment, the control circuit 11 may control each timing of data programming and verifying with time shifts between the cell arrays CA0 and CA1 by a predetermined delay time (about several micro-seconds as above mentioned). In another embodiment, the control circuit 11 may control (1) the data verification for the cell array CA1 at the time of data writing for the cell array CA0, or (2) the data verification for the cell array CA0 at the time of data writing for the cell array CA1 In an alternative embodiment, the control circuit may control performing data erasing for the cell arrays CA0 and CA1 simultaneously, and performing data verification for the cell arrays CA0 and CA1 by time division.

In the first to fourth embodiments, the data latch circuit 14c may comprise the global bit lines of the cell arrays CA0, CA1 and the predetermined switch unit (Q12 or Q13), and it may be configured by the dynamic latch circuit consisting of the stray capacitance of the global bit lines of the cell arrays CA0, CA1 and the predetermined switch unit (Q12 or Q13). For example, the above-mentioned operation of storing the write data of the cell array CA1 from global bit line GBLe1 into the latch 14a by a pre-read is equal to using the global bit line GBL as memory capacity, and using MOS transistor Q13 as a switch unit. Further, in the writing description of the global bit line switch circuit part 25 in FIG. 4B, the switch unit Q12 or Q13 can be replaced by the MOS transistor Q23 or Q24 driven by the signal BLSe or BLso of the global bit line switch circuits 22 and 23 in FIG. 4B. In addition, according to the composition, because there are double global bit lines GBLe and GBLo for the page buffer circuit 14, the dynamic latch can be functionalized for 2 bits.

Figure 5B:
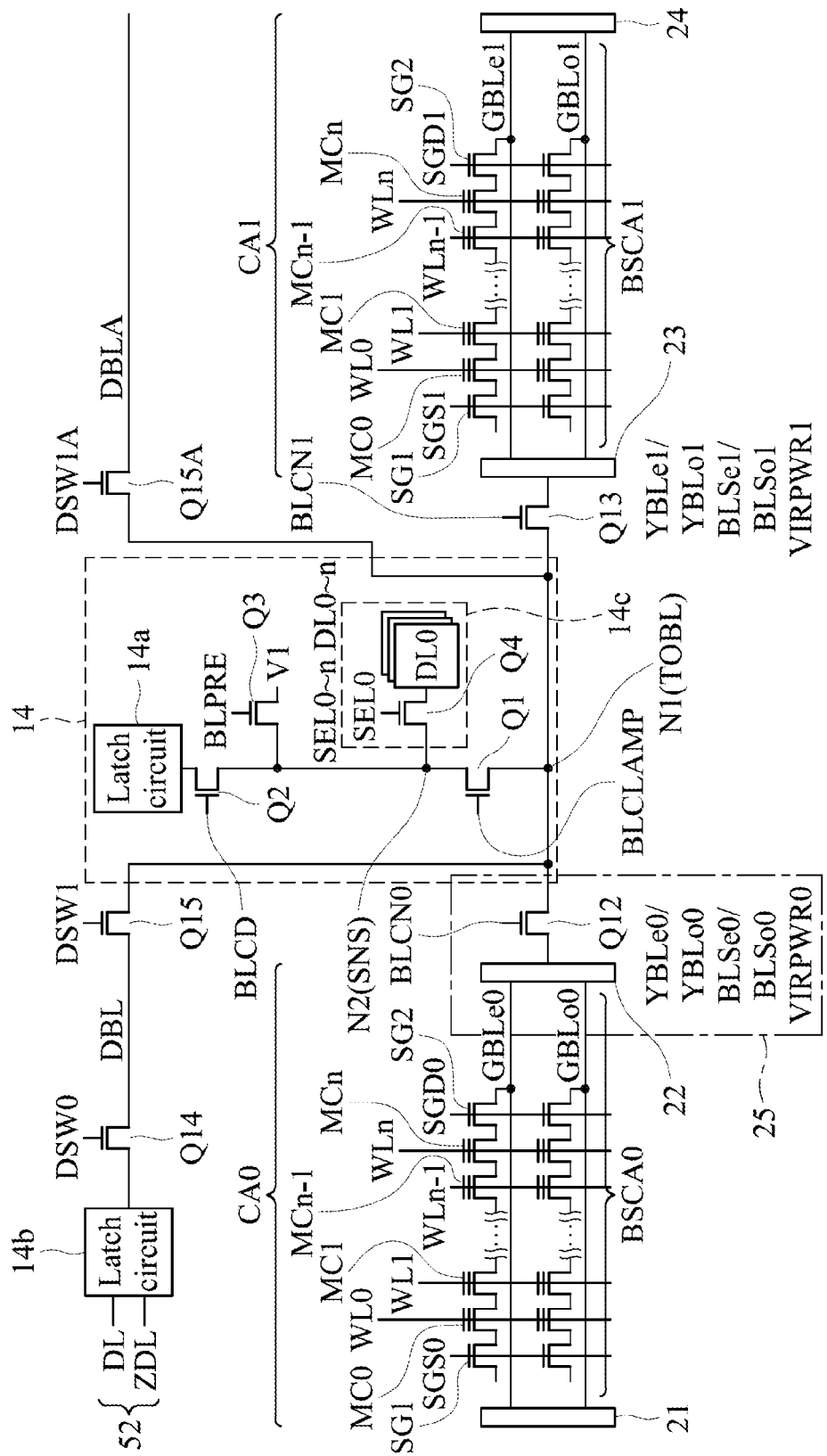
FIG. 5B is a circuit diagram illustrating a memory cell array 10 and the peripheral circuits of the NAND-type flash EEPROM according to a modulation of the second and fourth embodiments of the invention.

In the second and fourth embodiments, the data bit line DBL for connecting the page buffer circuit 14 with the latch circuit 14b is configured in the cell array CA0 side, as shown in FIGS. 3A and 5A. However, the invention is not limited to thereto, and the data bit line DBL and the other data bit line DBLA may be configured in the cell array CA1 side, as per the modification embodiments of the second and fourth embodiments shown in FIG. 5B. In the FIG. 5B, the other bit line DBLA is connected to the page buffer circuit 14 via the switch unit Q15A, which has the same composition as the switch unit Q15 and is controlled by the control signal DSW1A. In the embodiment, the data latch circuit 14c may comprise the data bit line DBL or the other data bit line DBLA, and the predetermined switch unit Q15 or Q15A, and it may be configured by the dynamic latch circuit consisting of the stray capacitance of the data bit line DBL or the other data bit line DBLA and the predetermined switch unit Q15, Q15A.

INDUSTRIAL APPLICATIONS

As described above, for the nonvolatile semiconductor storage device and control method thereof according to the invention, the invention can make the chip size smaller than conventional ones, and improve the read speed from a memory cell to a page buffer. In addition, regarding simultaneously programming two pages of cell arrays, the operation of programming and verifying of different pages can be accomplished without apparent time delay, namely the program speed can be improved.

What is claimed is:

1. A nonvolatile semiconductor storage device, comprising:
 a nonvolatile memory cell array, having a plurality of memory cells connected to global bit lines;
 a page buffer circuit, having a first latch circuit temporarily storing data read from and written to the nonvolatile memory cell array by a predetermined page unit;
 a second latch circuit, temporarily storing data input from and output to an external circuit; and
 a control circuit, controlling data reading and writing of the nonvolatile memory cell array,
 wherein the nonvolatile memory cell array is divided into a first cell array and a second cell array, the page buffer circuit is arranged between the first cell array and the second cell array, and the second latch circuit is arranged by the outside edge section of the first cell array;
 the page buffer circuit is connected to the second latch circuit via a global bit line of the first cell array;
 the control circuit controls data writing to the first cell array or the second cell array by transmitting the writing data to the page buffer circuit from the second latch circuit via the global bit line of the first cell array, after the writing data from the external circuit is latched in the second latch circuit, for data writing; and
 the control circuit controls outputting the data read from the first cell array or the second cell array to the external circuit by transmitting data to the second latch circuit from the page buffer circuit via the global bit line of the first cell array, for data reading.

2. The nonvolatile semiconductor storage device of claim 1, wherein the control circuit controls performing a time division operation of at least one of data writing, data reading and data erasing for the first cell array and the second cell array.

3. The nonvolatile semiconductor storage device of claim 2, wherein the control circuit controls each timing of data programming and verifying with time shifts between the first cell array and the second cell array by a predetermined delay time.

4. The nonvolatile semiconductor storage device of claim 2, wherein the control circuit controls the data verification for the second cell array at the time of data writing for the first cell array, or controls the data verification for the first cell array at the time of data writing for the second cell array.

5. The nonvolatile semiconductor storage device of claim 2, wherein the control circuit controls data erasing for the first cell array and the second cell array simultaneously, and performing data verification for the first cell array and the second cell by the time division operation.

6. The nonvolatile semiconductor storage device of claim 1, wherein the page buffer circuit further comprises a third latch circuit storing shunted data of another cell array when one of the first cell array and the second cell array performs data writing or data reading.

7. The nonvolatile semiconductor storage device of claim 6, wherein the third latch circuit further comprises a plurality of latches for memory cells in an MLC of storing data of a plurality of bits for each of the memory cells.

8. The nonvolatile semiconductor storage device of claim 6, wherein the third latch circuit further comprises a global bit line of the first cell array or the second cell array, and a switch unit, and the third latch circuit is constructed by a dynamic latch circuit composed of a stray capacitance of the global bit line of the first cell array or the second cell array and the switch unit.

9. The nonvolatile semiconductor storage device of claim 6, wherein the control circuit directly transmits data from the third latch circuit to the second latch circuit via the global bit line of the first cell array at the time of data reading.

10. A nonvolatile semiconductor storage device, comprising:
 a nonvolatile memory cell array, having a plurality of memory cells connected to global bit lines;
 a page buffer circuit, having a first latch circuit temporarily storing data read from and written to the nonvolatile memory cell array by a predetermined page unit;
 a second latch circuit, temporarily storing data input from and output to an external circuit; and
 a control circuit, controlling data reading and writing of the nonvolatile memory cell array,
 wherein the nonvolatile memory cell array is divided to a first cell array and a second cell array, the page buffer circuit is arranged between the first cell array and the second cell array, and the second latch circuit is arranged by the outside edge section of the first cell array;

the nonvolatile semiconductor storage device comprises a data bit line connecting the page buffer circuit to the second latch circuit;

the control circuit controls data writing to the first cell array or the second cell array by transmitting the writing data to the page buffer circuit from the second latch circuit via the data bit line, after the writing data from the external circuit is latched in the second latch circuit, for data writing; and the control circuit controls outputting the data read from the first cell array or the second cell array to the external circuit by transmitting data from the page buffer circuit to the second latch circuit via the data bit line, for data reading.

11. The nonvolatile semiconductor storage device of claim 10, wherein the control circuit controls performing a time division operation of at least one of data writing, data reading and data erasing for the first cell array and the second cell array.

12. The nonvolatile semiconductor storage device of claim 11, wherein the control circuit controls each timing of data programming and verifying with time shifts between the first cell array and the second cell array by a predetermined delay time.

13. The nonvolatile semiconductor storage device of claim 11, wherein the control circuit controls the data verification for the second cell array at the time of data writing for the first cell array, or controls the data verification for the first cell array at the time of data writing for the second cell array.

14. The nonvolatile semiconductor storage device of claim 11, wherein the control circuit controls data erasing for the first cell array and the second cell simultaneously, and performing data verification for the first cell array and the second cell by the time division operation.

15. The nonvolatile semiconductor storage device of claim 10, wherein page buffer circuit further comprises a third latch circuit storing shunted data of another cell array when one of the first cell array and the second cell performs data writing or data reading.

16. The nonvolatile semiconductor storage device of claim 15, wherein the third latch circuit further comprises a plurality of latches for memory cells in an MLC of storing data of a plurality of bits for each of the memory cells.

17. The nonvolatile semiconductor storage device of claim 15, wherein the page buffer circuit further comprises another data bit line other than the data bit line connecting the page buffer circuit to the second latch circuit, and a switch unit controlling the connection of the page buffer circuit.

18. The nonvolatile semiconductor storage device of claim 17, wherein the third latch circuit comprises the data bit line or the other data bit line and the switch unit; and the third latch circuit is constructed by a dynamic latch circuit composed of a stray capacitance of the stray capacitance of the data bit line or the other data bit line and the switch unit.

19. The nonvolatile semiconductor storage device of claim 15, wherein the third latch circuit further comprises a global bit line of the first cell array or the second cell array, and a switch unit; and the third latch circuit is constructed by a dynamic latch circuit composed of a stray capacitance of the global bit line of the first cell array or the second cell array and the switch unit.

20. The nonvolatile semiconductor storage device of claim 15, wherein the control circuit directly transmits data from the third latch circuit to the second latch circuit via the data bit line at the time of data reading.

21. A control method for a nonvolatile semiconductor storage device comprising a nonvolatile memory cell array having a plurality of memory cells connected to global bit lines, a page buffer circuit having a first latch circuit temporarily storing data read from and written to the nonvolatile memory cell array by a predetermined page unit, a second latch circuit temporarily storing data input from and output to an external circuit; and a control circuit controlling data reading and writing of the nonvolatile memory cell array, the nonvolatile memory cell array is divided into a first cell array and a second cell array, the page buffer circuit is arranged between the first cell array and the second cell array, the second latch circuit is arranged by the outside edge section of the first cell array, the page buffer circuit is connected to the second latch circuit via a global bit line of the first cell array, wherein the control method comprises:

using the control circuit to control data writing to the first cell array or the second cell array by transmitting the writing data to the page buffer circuit from the second latch circuit via the global bit line of the first cell array, after the writing data from the external circuit is latched in the second latch circuit, for data writing; and using the control circuit to control outputting the data read from the first cell array or the second cell array to the external circuit by transmitting data to the second latch circuit from the page buffer circuit via the global bit line of the first cell array, for data reading.

22. A control method for a nonvolatile semiconductor storage device comprising a nonvolatile memory cell array having a plurality of memory cells connected to global bit lines, a page buffer circuit having a first latch circuit temporarily storing data read from and written to the nonvolatile memory cell array by a predetermined page unit, a second latch circuit temporarily storing data input from and output to an external circuit, and a control circuit controlling data reading and writing of the nonvolatile memory cell array, the nonvolatile memory cell array is divided into a first cell array and a second cell array, the page buffer circuit is arranged between the first cell array and the second cell array, the second latch circuit is arranged by the outside edge section of the first cell array, the nonvolatile semiconductor storage device comprises a data bit line connecting the page buffer circuit to the second latch circuit, wherein the control method comprises:

using the control circuit to control data writing to the first cell array or the second cell array by transmitting the writing data to the page buffer circuit from the second latch circuit via the data bit line, after the writing data from the external circuit is latched in the second latch circuit, for data writing; and using the control circuit to control outputting the data read from the first cell array or the second cell array to the external circuit by transmitting data to the second latch circuit from the page buffer circuit via the data bit line, for data reading.

* * * * *